US006215686B1

(12) United States Patent
Deneroff et al.

(10) Patent No.: US 6,215,686 B1
(45) Date of Patent: Apr. 10, 2001

(54) MEMORY SYSTEM WITH SWITCHING FOR DATA ISOLATION

(75) Inventors: Martin M. Deneroff, Palo Alto; Kenneth M. Sarocky, San Francisco, both of CA (US); David Leo McCall, Eauclaire, WI (US); David Edward McCracken, Mountain View, CA (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/384,471

(22) Filed: Aug. 27, 1999

Related U.S. Application Data

(62) Division of application No. 09/247,256, filed on Feb. 9, 1999.

(51) Int. Cl.[7] .................................................. G11C 5/02
(52) U.S. Cl. .............................. 365/52; 365/63; 361/728; 439/955
(58) Field of Search ........................ 365/63, 52; 361/728; 439/955, 620

(56) References Cited

U.S. PATENT DOCUMENTS

| | | | |
|---|---|---|---|
| 5,283,877 | 2/1994 | Gastinel et al. .................. | 395/425 |
| 5,319,591 | 6/1994 | Takeda et al. ................... | 365/63 |
| 5,341,331 | 8/1994 | Jeon ................................ | 365/189.01 |
| 5,357,624 | 10/1994 | Lavan ............................. | 395/425 |
| 5,383,148 | 1/1995 | Testa et al. ...................... | 365/52 |
| 5,513,135 | 4/1996 | Dell et al. ....................... | 365/52 |
| 5,564,107 | 10/1996 | Atalla .............................. | 395/800 |
| 5,646,904 | 7/1997 | Ohno et al. ..................... | 365/233 |
| 5,661,677 | 8/1997 | Rondeau, II et al. ........... | 365/63 |
| 5,691,950 | 11/1997 | McClure ......................... | 365/230.03 |
| 5,761,132 | 6/1998 | Kim ................................ | 365/189.05 |
| 5,802,395 | 9/1998 | Connolly et al. ............... | 395/834 |
| 5,870,325 | * 2/1999 | Nielsen et al. .................. | 365/63 |
| 5,926,838 | 7/1999 | Jeddeloh ......................... | 711/167 |
| 5,945,886 | 8/1999 | Millar ............................. | 333/1 |

* cited by examiner

Primary Examiner—David Nelms
Assistant Examiner—Hoai V. Ho
(74) Attorney, Agent, or Firm—Wagner, Murabito & Hao LLP

(57) ABSTRACT

A memory system that includes switches for controlling data transfer that are disposed on the motherboard. The switches are selectively coupled to a controller and to connector receptacles that are adapted to receive a memory module. The memory system also includes resistors that are disposed on the motherboard for terminating data signals. In one embodiment, memory modules are accessed in pairs. That is, the data switches are used to control the flow of data signals such that data signals only flow to one pair of memory modules at any particular time. In one embodiment, the memory system of the present invention includes eight memory modules that use DDR SDRAM memory components. When 8 Mbit, 16 Mbit, 32 Mbit or 64 Mbit memory components are used, this configuration gives a range of memory configurations from 128 megabytes (Mbytes) to 1 gigabyte (Gbyte).

19 Claims, 36 Drawing Sheets

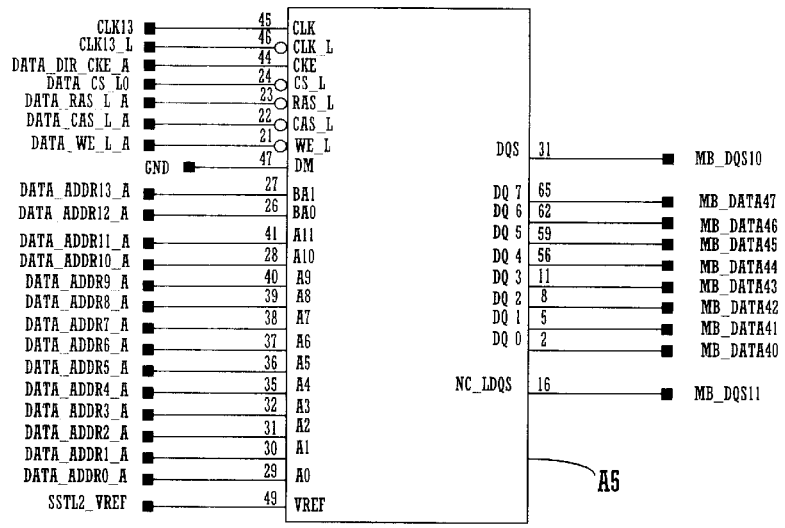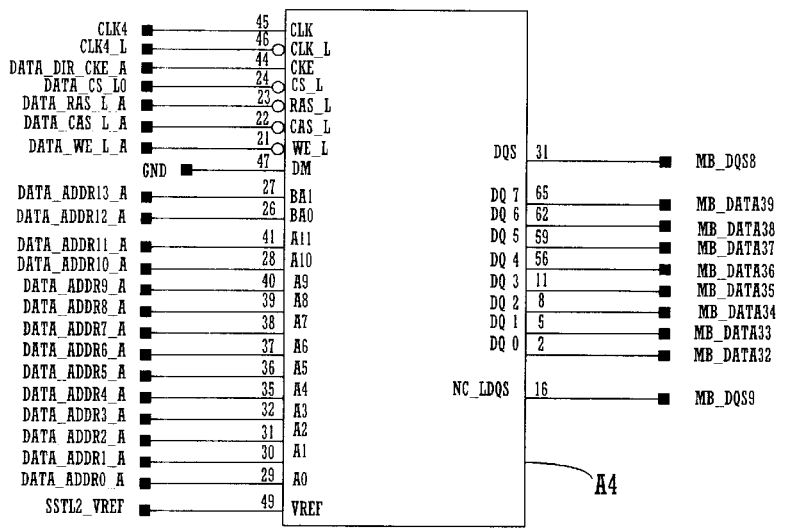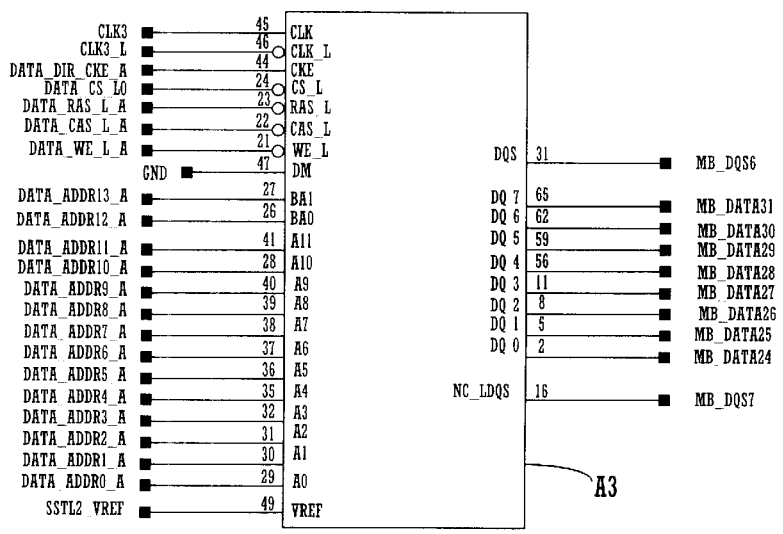
FIGURE 11 cont.

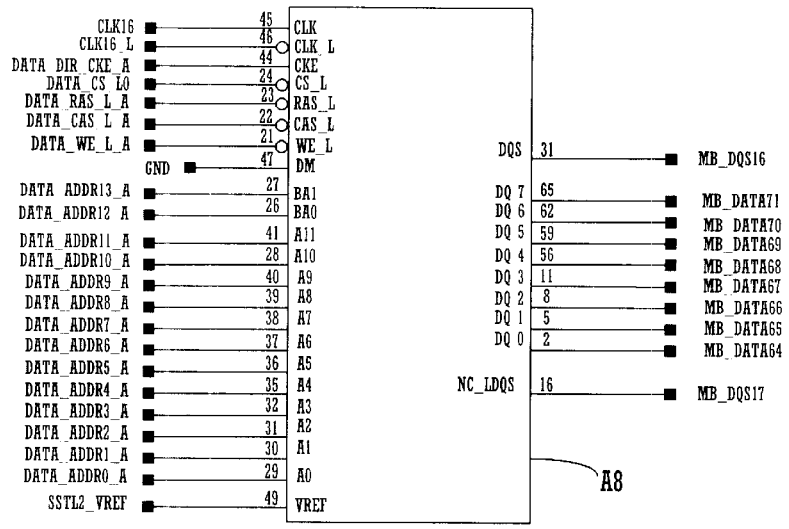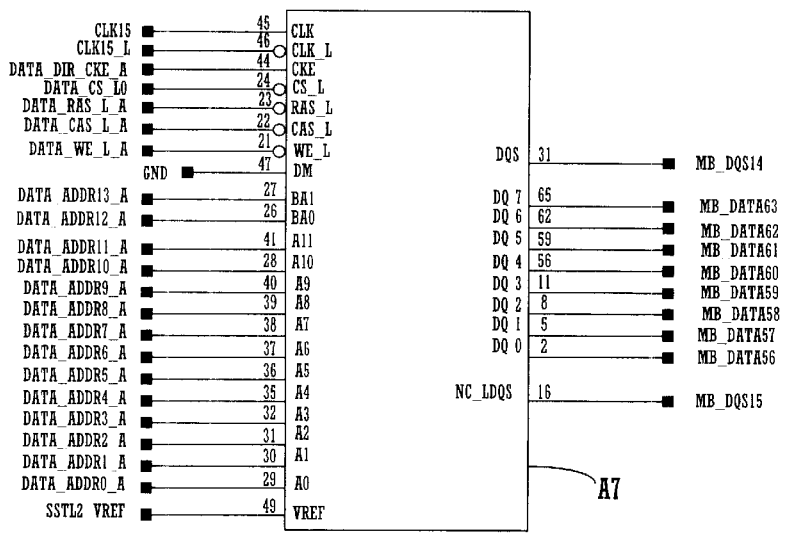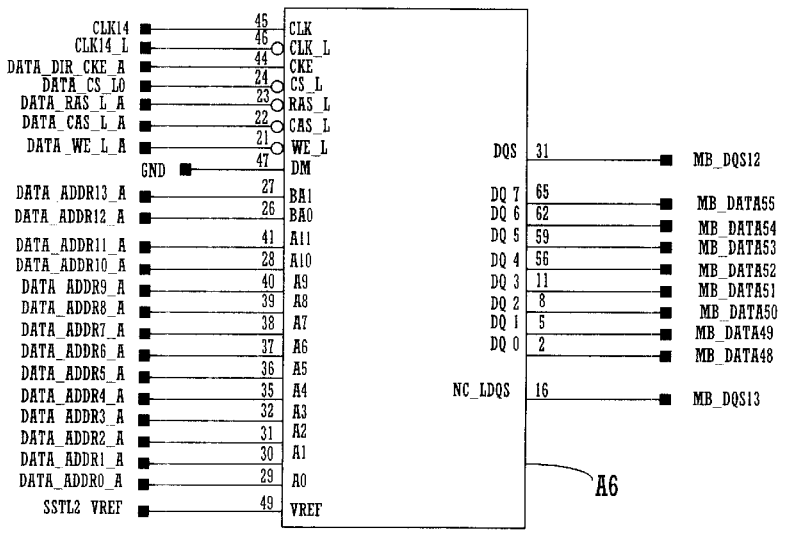
FIGURE 11 cont.

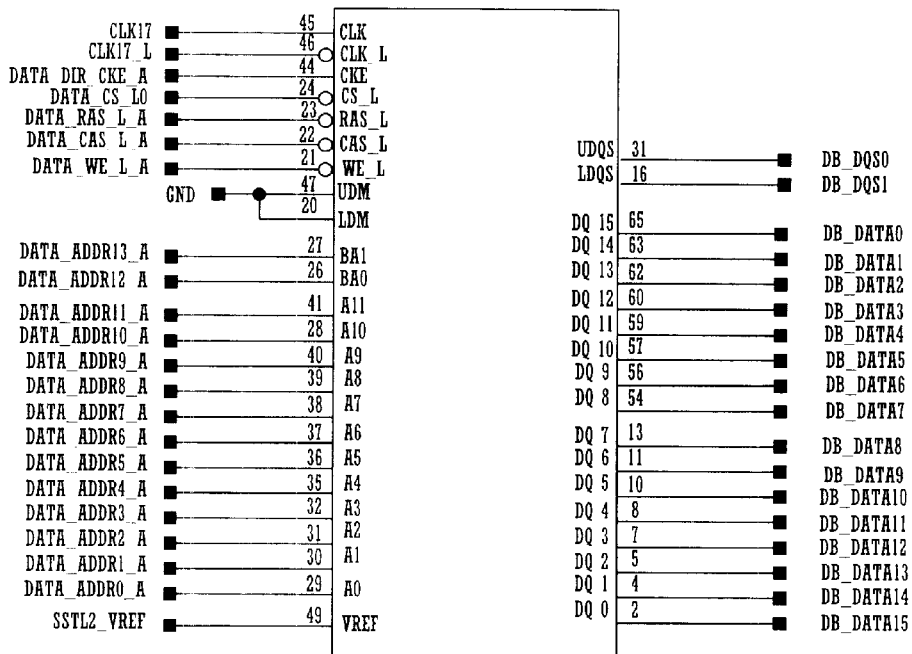
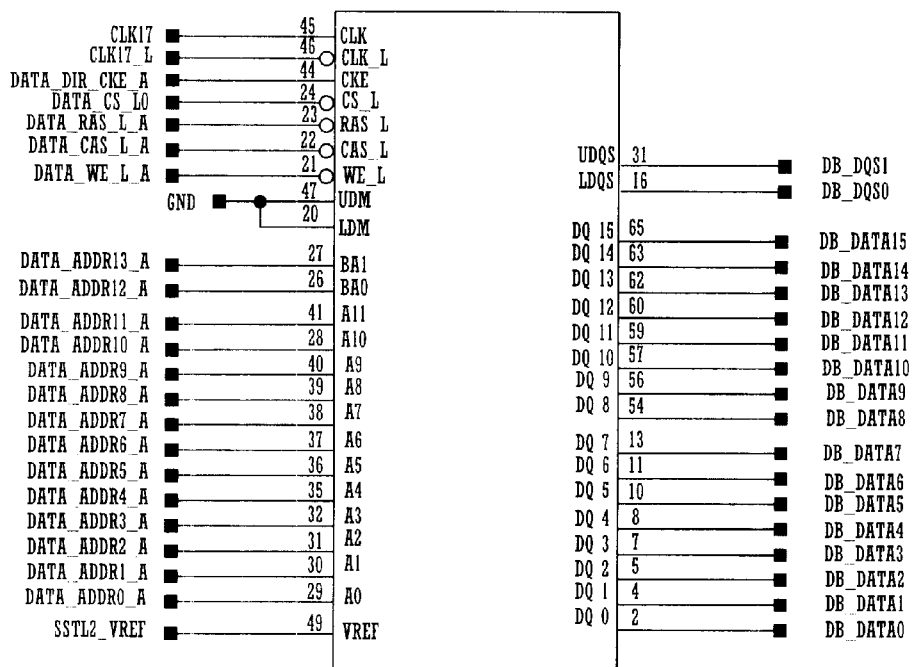
FIGURE 13

| FRONT (A-SIDE) | | BACK (B-SIDE) | | FRONT (A-SIDE) | | BACK (B-SIDE) | |
|---|---|---|---|---|---|---|---|
| PIN NO. | FUNCTION | PIN NO. | FUNCTION | PIN NO. | FUNCTION | PIN NO. | FUNCTION |
| 1 | NC, TCK | 148 | NC | 75 | DQ41 | 222 | DQ40 |
| 2 | NC, TDI | 149 | NC,TMS | 76 | VDDQ | 223 | VDDQ |
| 3 | NC, TDO | 150 | NC, PRES | 77 | DQ43 | 224 | DQ42 |
| 4 | GND | 151 | GND | 787 | GND | 225 | GND |
| 5 | DQ01 | 152 | DQ00 | 79 | DQS11 | 226 | DQS10 |
| 6 | VDDQ | 153 | VDDQ | 80 | VDD(AUX) | 227 | VDD |
| 7 | DQ03 | 154 | DQ02 | 81 | DQ45 | 228 | DQ44 |
| 8 | GND | 155 | GND | 82 | GND | 229 | GND |
| 9 | DQS01 | 156 | DQS00 | 83 | DQ47 | 230 | DQ46 |
| 10 | VDD | 157 | VDD | 84 | VDDQ | 231 | VDDQ |
| 11 | DQ05 | 158 | DQ04 | 85 | DQ49 | 232 | DQ48 |
| 12 | GND | 159 | GND | 86 | GND | 233 | GND |
| 13 | DQ07 | 160 | DQ06 | 87 | DQ51 | 234 | DQ50 |
| 14 | VDDQ | 161 | VDDQ | 88 | VDD | 235 | VDD |
| 15 | DQ09 | 162 | DQ08 | 89 | DQS13 | 236 | DQS12 |
| 16 | GND | 163 | GND | 90 | GND | 237 | GND |
| 17 | DQ11 | 164 | DQ10 | 91 | DQ53 | 238 | DQ52 |
| 18 | VDD | 165 | VDD | 92 | VDDQ | 239 | VDDQ |
| 19 | DQS03 | 166 | DQS02 | 93 | DQ55 | 240 | DQ54 |
| 20 | GND | 167 | GND | 94 | GND | 241 | GND |
| 21 | DQ13 | 168 | DQ12 | 95 | DQ57 | 242 | DQ56 |
| 22 | VDDQ | 169 | VDDQ | 96 | VDD | 243 | VDD |
| 23 | DQ15 | 170 | DQ14 | 97 | DQ59 | 244 | DQ58 |
| 24 | GND | 171 | GND | 98 | GND | 245 | GND |
| 25 | DQ17 | 172 | DQ16 | 99 | DQS15 | 246 | DQS14 |
| 26 | VDD | 173 | VDD | 100 | VDDQ | 247 | VDDQ |
| 27 | DQ19 | 174 | DQ18 | 101 | DQ61 | 248 | DQ60 |
| 28 | GND | 175 | GND | 102 | GND | 249 | GND |
| 29 | DQS05 | 176 | DQS04 | 103 | DQ63 | 250 | DQ62 |
| 30 | VDDQ | 177 | VDDQ | 104 | VDD | 251 | VDD |
| 31 | DQ21 | 178 | DQ20 | 105 | DQ65 | 252 | DQ64 |
| 32 | GND | 179 | GND | 106 | GND | 253 | GND |
| 33 | DQ23 | 180 | DQ22 | 107 | DQ67 | 254 | DQ66 |
| 34 | VDD | 181 | VDD | 108 | VDDQ | 255 | VDDQ |
| 35 | DQ25 | 182 | DQ24 | 109 | DQS17 | 256 | DQS16 |
| 36 | GND | 183 | GND | 110 | GND | 257 | GND |
| 37 | DQ27 | 184 | DQ26 | 111 | DQ89 | 258 | DQ68 |
| 38 | VDDQ | 185 | VDDQ | 112 | VDD | 259 | VDD |

FIGURE 17

| FRONT (A-SIDE) | | BACK (B-SIDE) | | FRONT (A-SIDE) | | BACK (B-SIDE) | |
|---|---|---|---|---|---|---|---|
| PIN NO. | FUNCTION | PIN NO. | FUNCTION | PIN NO. | FUNCTION | PIN NO. | FUNCTION |
| 39 | DQS07 | 186 | DQS08 | 113 | DQ71 | 260 | DQ70 |
| 40 | GND | 187 | GND | 114 | GND | 261 | GND |
| 41 | DQ29 | 188 | DQ28 | 115 | dirDQ01 | 262 | dirDQ00 |
| 42 | VDD | 189 | VDD | 116 | VDDQ | 263 | VDDQ |
| 43 | DQ31 | 190 | DQ30 | 117 | dirDQ03 | 264 | dirDQ02 |
| 44 | GND | 191 | GND | 118 | GND | 265 | GND |
| 45 | DQ33 | 192 | DQ32 | 119 | dirDQ05 | 266 | dirDQ04 |
| 46 | VDDQ | 193 | VDDQ | 120 | VDD | 267 | VDD |
| 47 | DQ35 | 194 | DQ34 | 121 | dirDQ07 | 268 | dirDQ06 |
| 48 | GND | 195 | GND | 122 | GND | 269 | GND |
| 49 | DQS09 | 196 | DQS08 | 123 | dirDQS01 | 270 | dirDQS00 |
| 50 | VDD | 197 | VDD | 124 | VDDQ | 271 | VDDQ |
| 51 | DQ37 | 198 | DQ36 | 125 | dirDQ09 | 272 | dirDQ08 |
| 52 | GND | 199 | GND | 126 | GND | 273 | GND |
| 53 | DQ39 | 200 | DQ38 | 127 | dirDQ11 | 274 | dirDQ10 |
| 54 | VDDQ | 201 | VDDQ | 128 | VDD | 275 | VDD |
| 55 | A1 | 202 | A0 | 129 | dirDQ13 | 276 | dirDQ12 |
| 56 | A3 | 203 | A2 | 130 | GND | 277 | GND |
| 57 | GND | 204 | GND | 131 | dirDQ15 | 278 | dirDQ14 |
| 58 | A5 | 205 | A4 | 132 | VDDQ | 279 | VDDQ |
| 59 | A7 | 206 | A6 | 133 | dirA1 | 280 | dirA0 |
| 60 | GND | 207 | GND | 134 | dirA3 | 281 | dirA2 |
| 61 | A9 | 208 | A8 | 135 | GND | 282 | GND |
| 62 | A8 | 209 | A10(AP) | 136 | dirA5 | 283 | dirA4 |
| 63 | GND | 210 | GND | 137 | dirA7 | 284 | dirA6 |
| 64 | BA0 | 211 | A12 | 138 | VDD | 285 | VDD |
| 65 | RAS | 212 | BA1 | 139 | dirA9 | 286 | dirA8 |
| 66 | VDD | 213 | VDD | 140 | dirA11 | 287 | dirA10(AP) |
| 67 | WE | 214 | CAS | 141 | GND | 288 | GND |
| 68 | WP | 215 | CKE | 142 | dirBA0 | 289 | dirA12 |
| 69 | GND | 216 | GND | 143 | dirRAS | 290 | dirBA1 |
| 70 | CK | 217 | CS0 | 144 | GND | 291 | GND |
| 71 | CK | 218 | CS1 | 145 | dirWE | 292 | dirCAS |
| 72 | GND | 219 | GND | 146 | dirCS1 | 293 | dirCS0 |
| 73 | SDA | 220 | SCL | 147 | GND | 294 | GND |
| 74 | GND | 221 | GND | | | | |

FIGURE 17 (continued)

| PIN | SIGNAL | I/O | TYPE | NAME | DESCRIPTION |
|---|---|---|---|---|---|
| 71,70 | CK, CK | I | LV-PECL | Clock | CK and CK are differential clock inputs. All address and control input signals are sampled on the positive edge of CK (negative edge of CK). |
| 215 | CKE | I | SSTL_2 | Clock Enable | CKE HIGH activates, and CKE LOW deactivates internal clock signals, and device input buffers and output drivers. Deactivating the clock provides PRECHARGE POWER-DOWN and SELF REFRESH operation (all banks idle), or ACTIVE POWER-DOWN. CKE is synchronous for all functions except Asynchronous Output disable. Input buffers, excluding CLK, CLK and CKE are disabled during power-down and refresh modes. |
| 217,218 | CS(n) | I | SSTL_2 | Chip Select | CS enables (registered LOW) and disables (registered HIGH) the command decoder. All commands are masked when CS is registered HIGH. CS provides for external bank selection on systems with multiple banks. |
| 65 | RAS | I | SSTL_2 | Row Address Strobe | |
| 214 | CAS | I | SSTL_2 | Column Address Strobe | |
| 67 | WE | I | SSTL_2 | Write Enable | |
| 55,56,58, 59,61, 62,202, 203,205, 206,208, 211,209 | A0-A9, A11-A12, A10(AP) | I | SSTL_2 | Main Memory Address | A0-A12 are sampled during the ACTIVATE Command (row address) and READ/WRITE Command (column address, with A10 defining AUTO PRECHARGE) to select one location out of the memory array in the respective bank. A10 is sampled during a PRECHARGE command to determine whether the PRECHARGE applies to one bank (A10 LOW) or all banks (A10 HIGH). If only one bank is to be precharged, the bank is selected by BA0, BA1. The address inputs also provide the op-code during a LOAD MODE REGISTER Command. |
| 211,64 | BA0-BA1 | I | SSTL_2 | Bank Address | BA0 and BA1 define to which bank an ACTIVATE, READ, WRITE or PRECHARGE command is being applied. |
| | DQ00-DQ72 | I/O | SSTL_2 | Data I/O | Data Input/Output |
| | DQS(n) | I/O | SSTL_2 | Data I/O Strobe | Data Input/Output Strobe. Output strobe edge-aligned with read data. Input strobe centered in write data. |
| 293,146 | dirCS(n) | I | SSTL_2 | Directory CS | |
| 143 | dirRAS | I | SSTL_2 | Directory RAS | |
| 292 | dirCAS | I | SSTL_2 | Directory CAS | |
| 145 | dirWE | I | SSTL_2 | Directory WE | |

FIGURE 18

| PIN | SIGNAL | I/O | TYPE | NAME | DESCRIPTION |
|---|---|---|---|---|---|
| 133,134,136,137,139,140,280,281,283,284,288,287 | dirA0-dirA9 dirA11-dirA12 dirA10(AP) | I | SSTL_2 | Directory Address | |
| 142,290 | dirBA0-dirBA1 | I | SSTL_2 | Directory Bank Addr | |
| 115,117,119,121,125,127,129,131, 262,264,266,268,272,274,276,278 | dirDQ00-dirDQ15 | I/O | SSTL_2 | Directory Data I/O | |
| 123,270 | dirDQS(n) | I/O | SSTL_2 | Directory Data Strobe | |
| 1 | TCK | JTAG | JTAG | Test Port Clock | Serial scxa test clock input |
| 2 | TDI | JTAG | JTAG | Test Data In | Serial scan data input |
| 3 | TDO | JTAG | JTAG | Test Data Out | Serial Scan data out |
| 149 | TMS | JTAG | JTAG | Test Mode Select | Enables Test Scan Clock and is used to select test modes. |
| 150 | PRES | JTAG | JTAG | | |
| 73 | SDA | SPD | SPD | Serial Data Line | |
| 220 | SCL | SPD | SPD | Serial Data Clock | |
| 68 | WP | SPD | SPD | Write Protect | |
| 10,18,26,34,42,50,66,88,96,104,112, 120,128,138,157,165,173,181,189, 197,213,227,235,243,251,259,267, 275,285 | $V_{DD}$ | P/S | | | Device Power Supply(2.5 Vdc) |
| 80 | $V_{DDQ}$ (aux) | P/S | | | Serial Presence PROM Power Supply (3.3 Vdc) |
| 6,14,22,30,38,48,54,76,84,92,100, 108,118,124,132,153,161,169,177, 185,193,201,223,231,239,247,255, 263,271,279 | $V_{DDQ}$ | P/S | | | Output Data Power Supply (2.5 Vdc) |
| 4,8,12,16,20,24,28,32,36,40,44,48,52, 57,60,63,69,72,74,78,82,86,90,94,98, 102,108,110,114,118,122,126,128,130,135,141,144,147,151,155,159,163, 167,171,175,179,183,187,191,195,199,204,2007,210,216,219,221,225,229,233,237,241,245,249,253,257,261,265,269,273,277,282,288,291,294 | GND | P/S | | | Electrical Ground |

FIGURE 18(continued)

| Symbol | Parameter | Min | Max | Unit |
|---|---|---|---|---|
| tAC | Access time from CK/CK | -1 | 1 | ns |
| tCH | Clock HIGH Level Width | 0.45 | 0.55 | tCK |
| tCL | Clock LOW Level Width | 0.45 | 0.55 | tCK |
| tCK | Clock Cycle Time(CL=2) | 10 | 15 | ns |
| tDH | Data-in Hold Time | .75 | | ns |
| tDS | Data-in Setup Time | .75 | | ns |
| tHZ | Data-out High-impedance Time from CK/CK | -1 | 1 | ns |
| tLZ | Data-out Low-impedance Time from CK/CK | -1 | 1 | ns |
| tDSDQ | DQS-DQ Skew | -0.75 | 0.75 | ns |
| tDV | DQ/DQS Output Valid Time | 3.5 | | ns |
| tDSS | Clock to DQS Delay | 0.75 | 1.25 | tCK |
| tDSL | DQS (LOW) Input Valid Time | 4 | 6 | ns |
| tDSH | DQS (HIGH) Input Valid Time | 4 | 6 | ns |
| tMRD | LOAD MODE REGISTER Command Cycle Time | 2 | | tCK |
| tWPR | Write Preamble Setup Time | 0 | | ns |
| tWPO | Write Postamble | 4 | 6 | ns |
| tWCP | Wite Command to DQS Low-impedance | 0 | | ns |
| tIH | Input Hold Time (Address or Control) | 1.5 | | ns |
| tIS | Input Setup Time (Address or Control) | 1.5 | | ns |
| tRPR | Read Preamble | 9 | 11 | ns |
| tRPO | Read Postamble | 4 | 6 | ns |
| tRAS | ACTIVATE to PRECHARGE Command | 50 | 120,000 | ns |
| tRC | AUTO REFRESH, ACTIVATE Command Period | 80 | | ns |
| tRCD | ACTIVATE to READ or WRITE Command Delay | 20 | | ns |
| tREF | Refresh Period (4098 rows) | | 64 | ms |
| tRP | PRECHARGE Command Period | 20 | | ns |
| tRRD | ACTIVATE Bank A to ACTIVATE Bank B Command | 20 | | ns |
| tT | Input Transition Time for SSTL_2 Inputs | 500 | 1500 | ps |
| tT(CK) | Input Transition Time for LV-PECL Clock (CK/CK) | 200 | 1000 | ps |
| tWR | Write recovery Time | 2 | | tCK |
| tWTR | Write Data In to Read Command Delay | 1 | | tCK |
| tXSR | Exit SELF REFRESH to ACTIVATE Command | 80 | | ns |

FIGURE 19

MEMORY SYSTEM WITH SWITCHING FOR DATA ISOLATION

This is a divisional of copending application Ser. No. 09/247,256 filed on Feb. 9, 1999 which designated in the U.S.

TECHNICAL FIELD

The present claimed invention relates to the field of memory storage systems. More particularly, the present invention relates to a memory storage system that includes a memory module on which memory devices are disposed.

BACKGROUND ART

Recent computer systems require faster microprocessors. These computer systems which require fast microprocessors require high memory bandwidth and high memory component capacity. This is particularly true in systems that contain multiple fast microprocessors.

In order to meet the demands of systems containing multiple fast microprocessors, some recent prior art memory modules include up to eighteen memory components on each memory module. These memory systems typically use Dual Inline Memory Modules (DIMMs) aligned in parallel. Typically, each DIMM includes memory components that are Dynamic Random Access Memory (DRAM) semiconductor devices or Synchronous Dynamic Random Access Memory (SDRAM) devices. At slower speeds, these prior art memory modules function adequately. However, at speeds of 200 megahertz and more, signal distortion occurs. This signal distortion causes ringing and edge rate slow-down. In some cases, the signal distortion results in insufficient signal to transfer data.

Recent attempts to meet the demands of systems containing multiple fast microprocessors include architectures that use data switching. Such systems include Field Effect Transistors (FET) devices that operate as switches located on each memory module. These FET switches, in effect, switch off individual memory modules such that only one or two memory modules are transmitting data at any one time. This significantly reduces signal distortion.

Memory modules that include FET switches located on each memory module are effective in reducing signal distortion. However, such memory modules are large and are expensive to manufacture. The inclusion of multiple FET switches adds cost and increases the required size of each memory module. Also, the connection scheme is complicated by the need to couple each data line to one or more FET. This results in a memory module that is complex and that is expensive to manufacture.

Prior art memory modules typically include terminal resistors located on each memory module. These terminal resistors couple to each data line. The terminal resistors take up valuable space on each memory module. Also, the terminal resistors increase the manufacturing cost of the memory module. In addition, such prior art memory modules typically include Series Stub Termination Logic (SSTL) which takes up valuable space on each memory module and increases the manufacturing cost of the memory module.

What is needed is a memory system that has a high memory component capacity and a high data bandwidth while minimizing distortion. Also, a memory system is needed that meets the above requirements and that includes a memory module that is inexpensive to manufacture. In addition, a memory system is needed that meets the above requirements and that includes a memory module that is smaller than prior art memory modules that include FET switches. The present invention provides an elegant solution to the above needs.

DISCLOSURE OF THE INVENTION

The present invention provides a memory system and memory module that has a high memory component capacity and a high data bandwidth while minimizing distortion. This is achieved using a memory system that includes data switching but which does not include FET switches for data switching on each memory module. Also, individual memory modules do not include terminal resistors for data lines. This results in a memory module that is inexpensive to manufacture and that is smaller than prior art memory modules that include FET switches.

A memory system that includes switches for controlling data transfer is disclosed. In one embodiment, the memory system includes a memory controller that is coupled to a motherboard. Data switches are also disposed on the motherboard and are selectively coupled to the controller. Receptacles that are adapted to receive a memory module are coupled to the memory controller. The memory system also includes resistors that are coupled to Each connector receptacle for terminating data signals.

The memory system also includes address/control buffers disposed on the motherboard that buffer address and control signals. The use of multiple address/control buffers provides the necessary bandwidth so as to allow for fast access and control of memory components.

In one embodiment, memory modules are accessed in pairs. That is, the data switches are used to control the flow of data signals such that data signals only flow to one pair of memory modules at any particular time. This allows for high-speed operation while minimizing distortion and interference between adjoining and nearby memory modules due to radio frequency interference.

In one embodiment, each memory module includes twenty memory components. However, memory modules are adapted to be configured with fewer or more memory components on a given memory module. In one alternate embodiment, memory modules having forty memory components on each memory module are disclosed.

In one embodiment, the memory system of the present invention includes eight memory modules that use Double Data Rate (DDR) SDRAM memory components. The eight memory modules are used in pairs. When 64 Mbit, 128 Mbit or 256 Mbit memory components are used, this configuration gives a range of memory configurations from 128 megabytes (Mbytes) to 1 gigabyte (Gbyte).

The memory system of the present invention includes resistors mounted on the motherboard and the same set of resistors is used to terminate data lines of multiple memory modules. Because only two memory modules are active at any time, only a sufficient number of resistors to terminate two memory modules is required. Thus, the memory system of the present invention requires fewer resistors than prior art memory systems that include memory modules that have resistors for data termination on each memory module (a full set of resistors is required on each prior art memory module). Because fewer resistors are required, the memory system of the present invention is less expensive than prior art memory systems that include memory modules that have resistors for data termination on each memory module.

By using switches that are placed on the motherboard, the memory system of the present invention achieves a shorter circuit than that of prior art memory systems that include switches located on each memory module. That is, by placing the switches on the motherboard, there is no need to drive the connector receptacle and the circuitry on each memory module that leads to a switch as is required by prior art memory modules that include switches located on each memory module. In addition, by using switches placed on the motherboard, system performance becomes more predictable. Any number of DIMMs (usually 1 to 4) can be placed in the memory system without affecting performance since the switches isolate unused DIMM connectors from the system. This allows for less performance variation, resulting in the ability to operate at the noted higher frequencies.

It is important to match the amount of memory to customer needs. In prior art systems, each time memory is added via a new DIMM, performance of the memory signal transmission is impacted by the placement of this additional load on the transmission system. At slower speeds, this can be tolerated. However, at higher speeds, this performance variation can not be tolerated. The present invention eliminates this variation by placing switches on the motherboard. Thus, in the present invention, the load on the controller is the same irrespective of the number of DIMMs in the system. This allows for operation at higher frequencies since the loading impact on the controller is reduced.

As previously discussed, the present invention includes switches placed on the motherboard. Thus, there is no need to place switches on each memory module. Because the memory modules of the present invention do not include switches, they are less expensive than prior art memory modules that include switches. Also, the memory modules of the present invention are less expensive because they do not require Series Stub Termination Logic (SSTL) related circuits on the memory module.

The present invention includes resistors for data termination that are disposed on the motherboard. Thus, there is no need to place resistors on each memory module for terminating data lines. Because the memory module of the present invention does not include resistors, the memory module of the present invention is less expensive than prior art memory modules that include resistors for data line termination.

The memory module of the present invention can be manufactured in a size that is physically smaller than the size of prior art memory modules. That is, because there is no need to place switches on each memory module, the memory module of the present invention can be made smaller than prior art memory modules that include switches. Also, because there is no need to place resistors on each memory module for terminating data lines, the memory module of the present invention can be made smaller than prior art memory modules that include resistors for data line termination.

The memory system and memory module of the present invention has a high memory component capacity and a high data bandwidth while minimizing distortion. Also, the memory module of the present invention meets the above requirements and is inexpensive to manufacture. In addition, the memory module of the present invention is smaller than prior art memory modules that include switches.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 13 is a diagram showing connections to memory components that are used to store directory data for a memory module that includes twenty memory components in accordance with the present claimed invention.

FIG. 17 is a chart showing pin connections and functions for a memory module that includes twenty memory components in accordance with the present claimed invention.

FIG. 18 is a chart showing pin connections and functions and descriptions for a memory module that includes twenty memory components in accordance with the present claimed invention.

FIG. 19 is a chart showing timing conditions for a memory module that includes twenty memory components in accordance with the present claimed invention.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
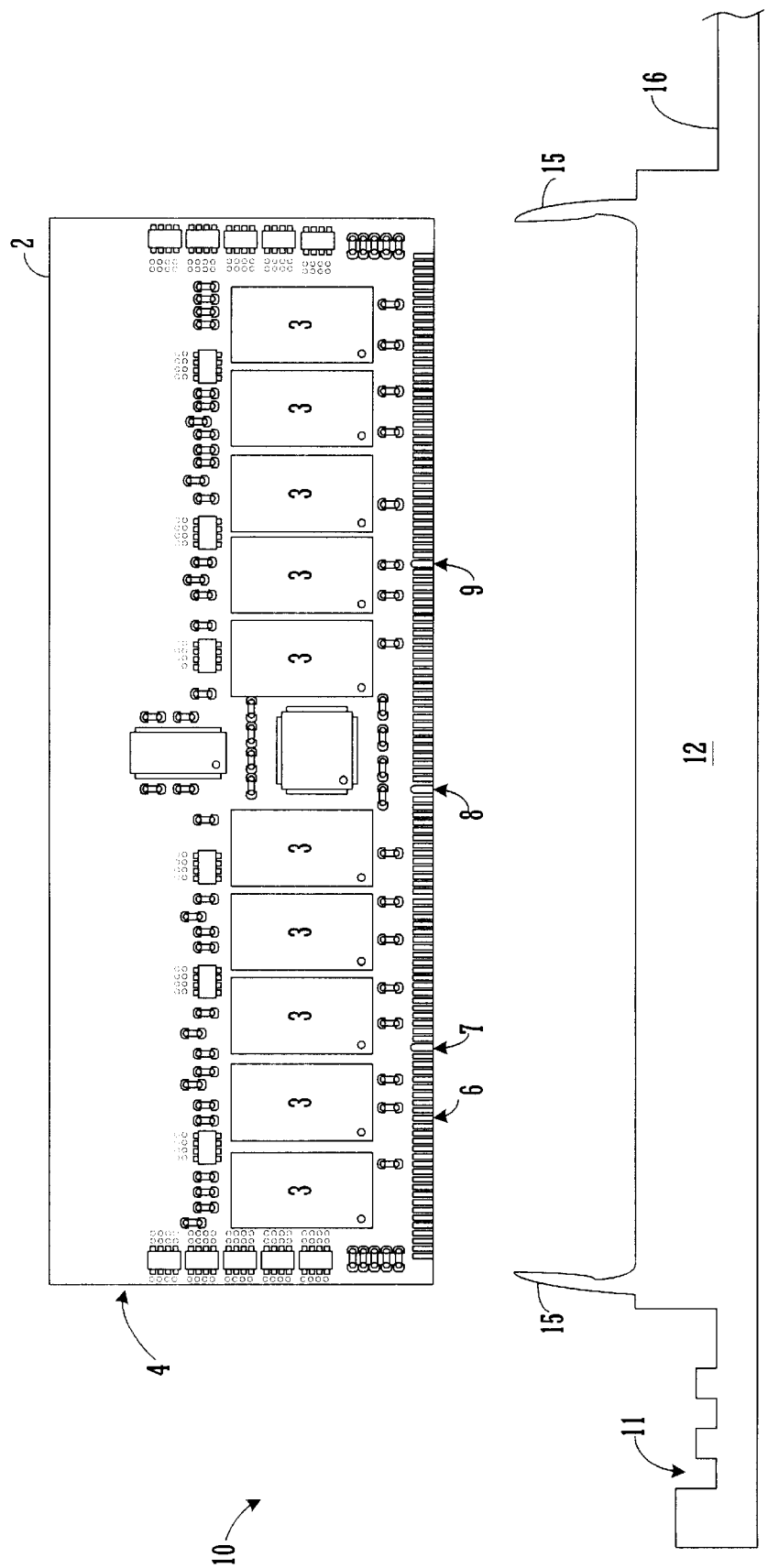
FIG. 1 is a diagram of a memory system showing a circuit board on which a connector receptacle and electronic circuitry is disposed and a memory module in accordance with the present claimed invention.

Referring now to FIG. 1, memory system 10 is shown to include electrical circuitry 11 that is disposed on circuit board 16. Connector receptacle 12 is also disposed on circuit board 16 and is electrically coupled to electrical circuitry 11. Memory module 4 includes circuit card 2 and memory components 3. Memory components 3 are attached to circuit board 2 and are electrically connected to contact pads 6 via conductive traces (not shown). In one embodiment, memory module 4 is a Dual Inline Memory Module (DIMM) and memory components 3 are Dynamic Random-Access Memory (DRAM) devices. In one embodiment, the DRAM devices that are used are DDR SDRAM devices that use an internal, pipelined double-data-rate architecture to achieve high-speed operation.

In one embodiment, memory module 4 includes identification device 1 that allows for identification of memory module 4. In one embodiment, identification device 1 stores a serial number and/or other data that identifies memory module 4. In this embodiment, electrical circuitry 11 includes electrical circuits that allow for the operation of only those memory modules that include authorized identification data. This prevents use of unauthorized memory modules. Thus, reducing down time and defects related to the use of sub-standard memory modules.

In operation, memory module 4 is inserted into connector receptacle 12. Individual contact pads of contact pads 6, also referred to as "pins" make electrical contact with corresponding sockets (not shown) in connector receptacle 12 so as to electrically connect the electrical circuits on memory module 4 to the electrical circuitry 11 located on circuit board 16. Clips 15 hold memory module 4 securely in place when it is inserted into connector receptacle 12. Alignment notches within connector receptacle 12 (not shown) engage indentations 7–9 on memory module 4 so as to provides for proper alignment and positioning of memory module 4.

Figure 2A:
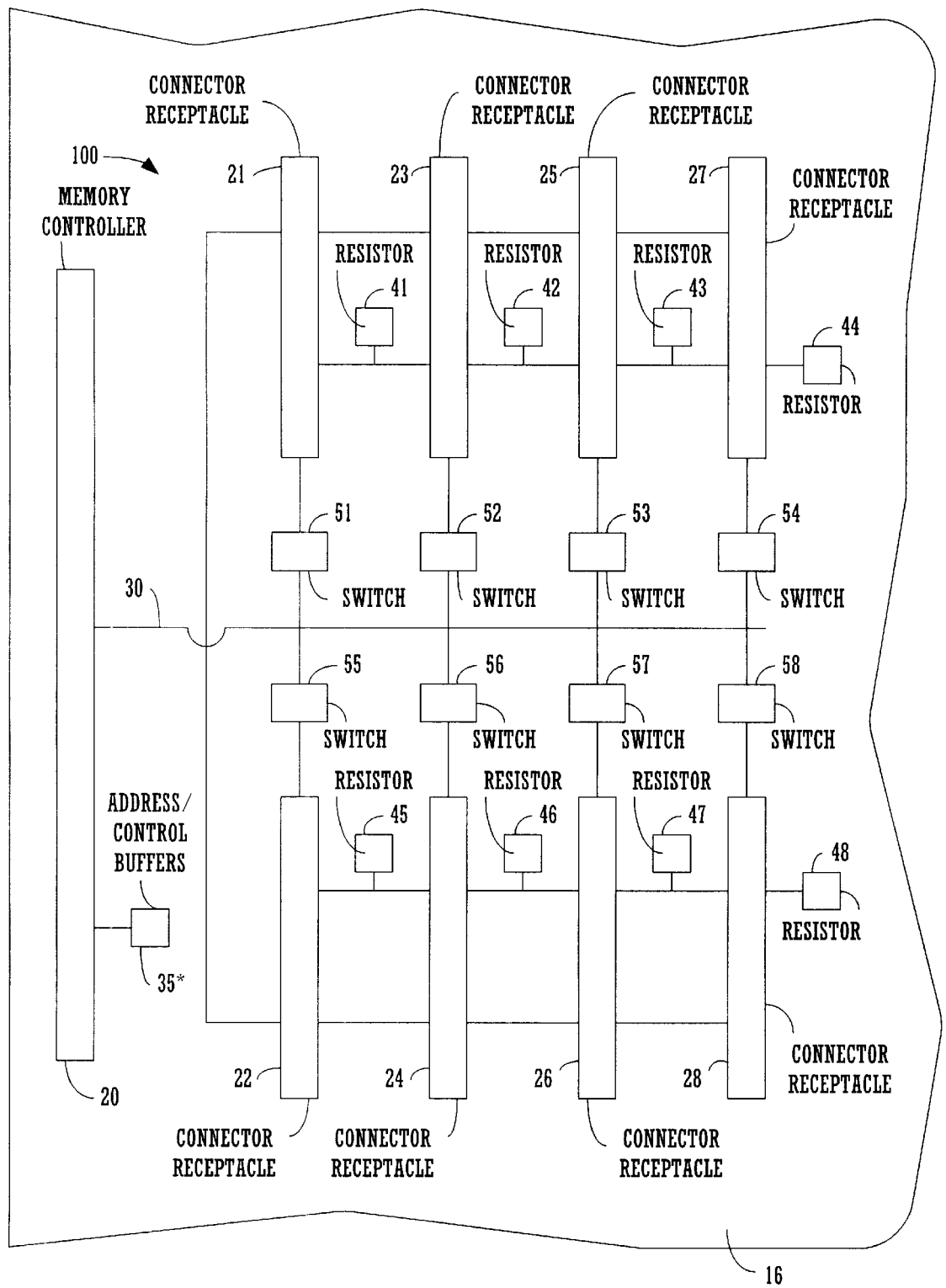
FIG. 2A is a top view showing a memory system that is adapted to receive eight memory modules in accordance with the present claimed invention.

FIG. 2A shows a memory system 100 that includes a circuit board 16 on which connector receptacles 21–28 are disposed. Connector receptacles 21–28 are adapted to receive up to 8 memory modules (not shown). In one embodiment, connector receptacles 21–28 are adapted to receive memory modules that include 294-pin RIMM style edge connectors. Memory system 100 includes memory controller 20 that is electrically connected to connector receptacles 21–28 by data bus 30 and address/control bus 32. Resistors, shown generally as resistors 41–48, electrically couple to connector receptacles 21–28 for terminating data lines. More specifically, in one embodiment, resistors 41–44 couple to connector receptacles 21–24 for termination of data lines coupled to connector receptacles 21–24. Similarly, resistors 45–48 couple to connector receptacles 25–28 for termination of data lines coupled to connector receptacles 25–28.

In one embodiment, memory controller 20 includes logic for detecting the identification of memory modules. That is, memory module 20 determines whether any memory module inserted into ones of connector receptacles 21–28 includes an identification device (e.g. identification device 1 of FIG. 1) that includes information identifying the memory module as being an authorized memory module. If the memory module is an authorized memory module, the memory module will be used to store and retrieve data. However, if the memory module is not identified as an authorized memory module, memory controller 20 generates an error message and will not use the memory module for storing and retrieving data. This prevents the use of sub-standard memory modules and memory components.

In one embodiment, address/control buffers, shown generally as address/control buffers 35 are disposed between memory controller 20 and connector receptacles 21–28. Depending on the desired characteristics of memory system 100, various configurations of address/control bus connection and address/control buffering can be used. In one embodiment, address/control buffers 35 includes seven buffers that are coupled to address/control bus 32 such that they are electrically coupled to memory controller 20 and to connector receptacles 21–28.

Continuing with FIG. 2A, in one embodiment, data bus 30 includes 216 data lines that couple to connector receptacles 21–28, with 108 data lines selectively coupled to each of connector receptacles 21, 23, 25 and 27, and with 108 data lines selectively coupled to each of connector receptacles 22, 24, 26, and 28. In this embodiment, the memory modules (not shown) disposed in connector receptacles connector receptacles 21, 23, 25 and 27 operate as a first bank of memory modules and the memory modules disposed in connector receptacles 22, 24, 26, and 28 operate as a second bank of memory modules.

Still referring to FIG. 2A, switches 51–58 are coupled to data bus 30 so as to selectively allow data to be coupled to connector receptacles 21–28. More particularly, switches 51–58 couple to data lines of data bus 32 so as to selectively allow data to flow to only to those memory modules that are active at a particular time when memory modules are disposed in connector receptacles 21–28. In one embodiment, switches 51–58 are Field Effect Transistors (FETs) that operate so as to selectively activate pairs of memory modules such that only two memory modules are active at any one time when memory modules are disposed in connector receptacles 21–28. Though any of a number of different configurations can be used for switching data lines, in one embodiment, each of switches 51–58 consists of 6 individual 20-bit switches. This gives a total of 48 20-bit switches. By preventing unnecessary data transmission, switches 51–58 decrease signal distortion and interference resulting from radio frequency transmission.

In one embodiment of the present invention, switches 51–58 operate to selectively allow data to pass to ones of connector receptacles 21–29 such that only two memory modules are active at any time. In one embodiment, switches 52–54 and switches 56–58 are selectively closed while switches 51 and 55 are open for driving the memory modules in connector receptacles 21–22. Similarly, switches 51, 53–55 and 57–58 are selectively closed while switches 52 and 56 are open for driving the memory modules in connector receptacles 23–24. Memory modules disposed in connector receptacles 25–26 are driven by opening switches 53 and 57 and closing switches 51–52, 54–56 and 58. Memory modules disposed in connector receptacles 27–28 are driven by opening switches 54 and 58 and closing switches 51–53 and 55–57.

Figure 2B:
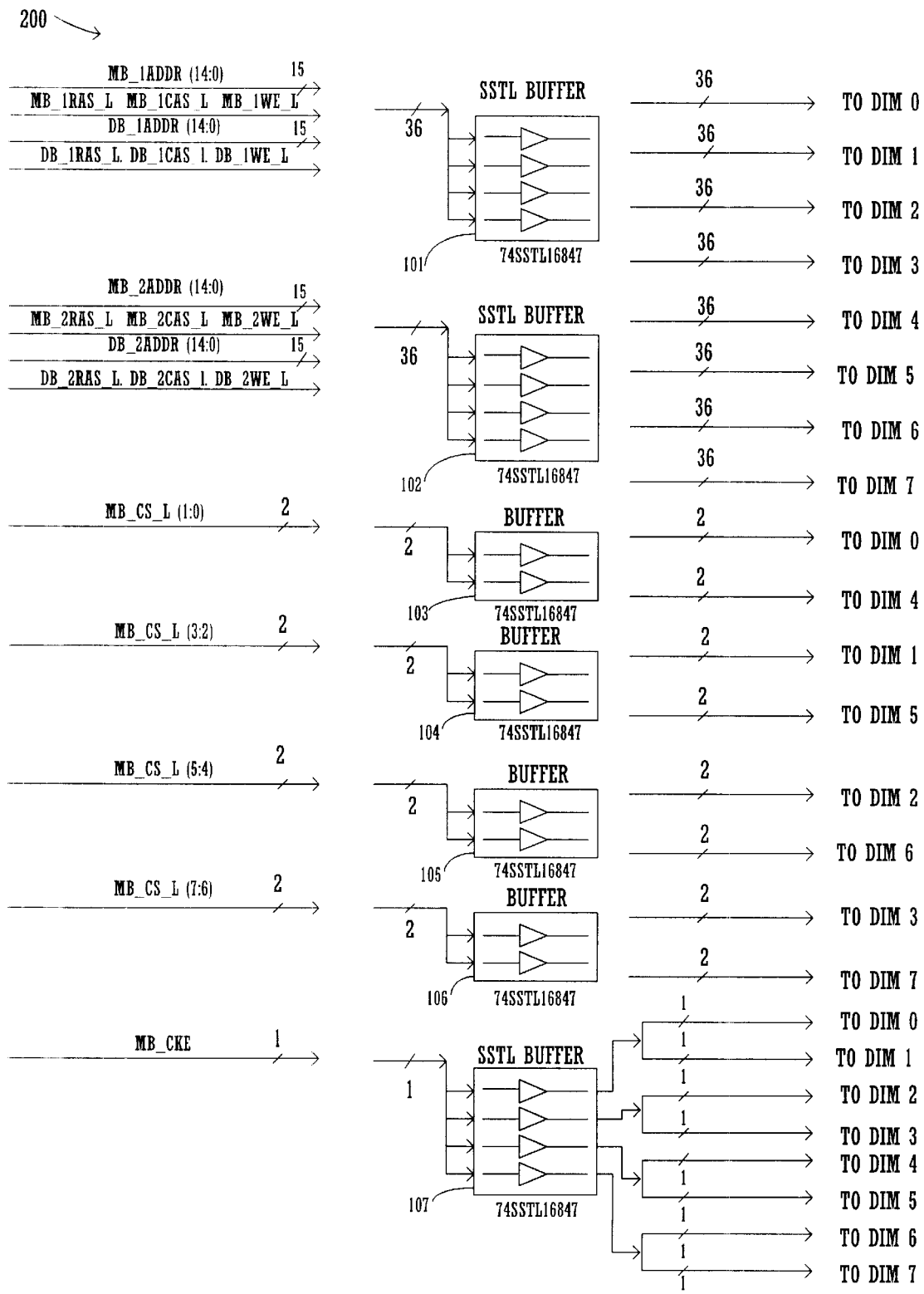
FIG. 2B is a diagram showing portions of a memory system that includes eight memory modules in accordance with the present claimed invention.

FIG. 2B shows an embodiment of a memory system 200 that includes memory modules that are DIMMs (shown as DIMM 0–DIMM 7). In one embodiment DIMM 0–DIMM 7 are disposed in each of connector receptacles 21–28 of FIG. 2a. In the embodiment shown in FIG. 2B, address/control buffers 35 of FIG. 2A include seven buffers, shown as buffers 101–107. In one embodiment, buffer 101 is a (SSTL) buffer that couples address signals to DIMM 0–DIMM 3 and buffer 102 is a SSTL buffer that couples address signals to DIMM 4–DIMM 7. Buffers 103–106 selectively couple control signals to DIMM 0–DIMM 7.

Though memory system 100 of FIG. 2A is shown to include eight connector receptacles, in an alternate embodiment, fewer or more connector receptacles could be used. Similarly, memory system 200 of FIG. 2B could include more or fewer DIMMs.

Figure 3:
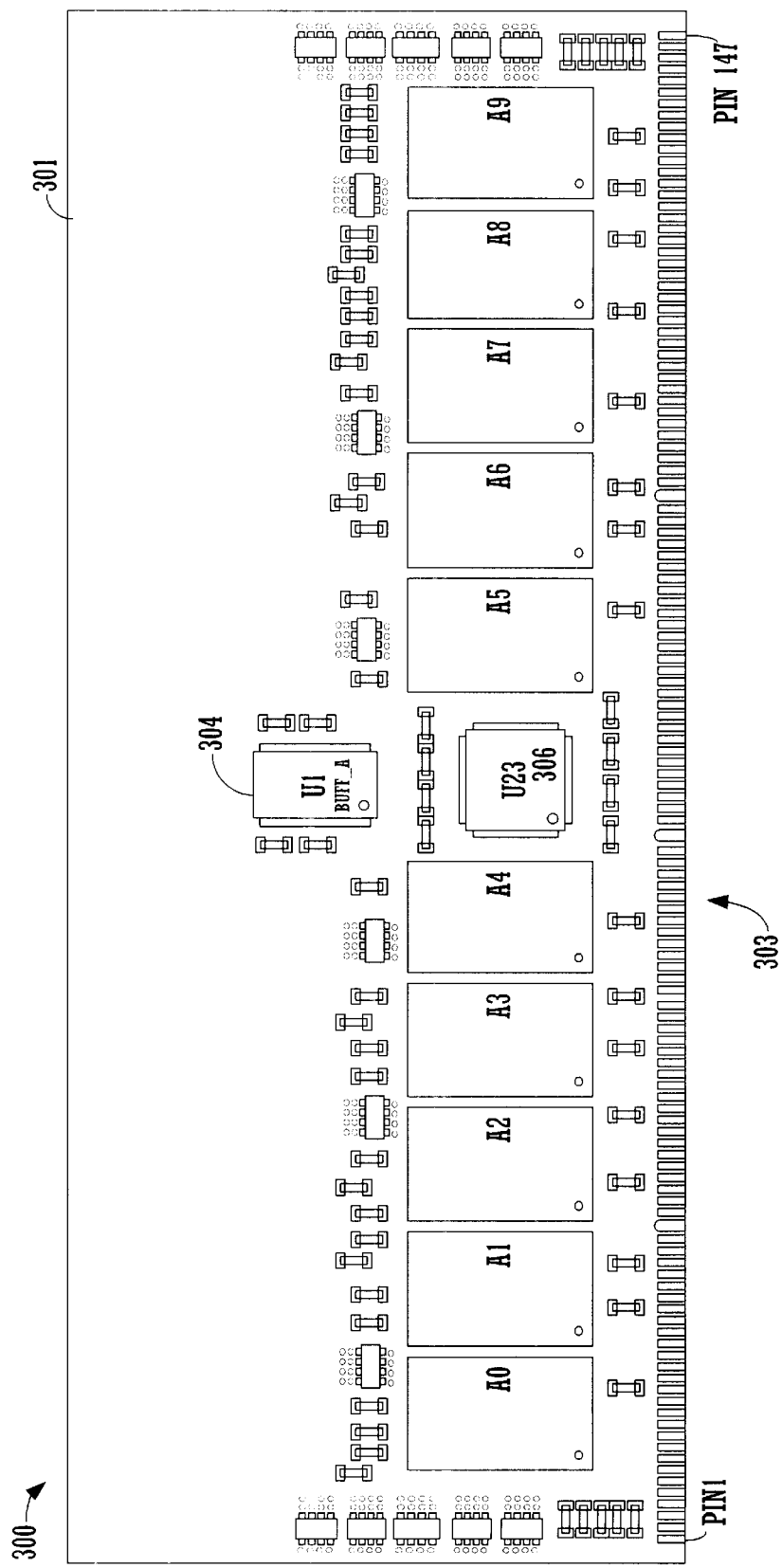
FIG. 3 is front side view of a memory module that includes twenty memory components in accordance with the present claimed invention.
Figure 4:
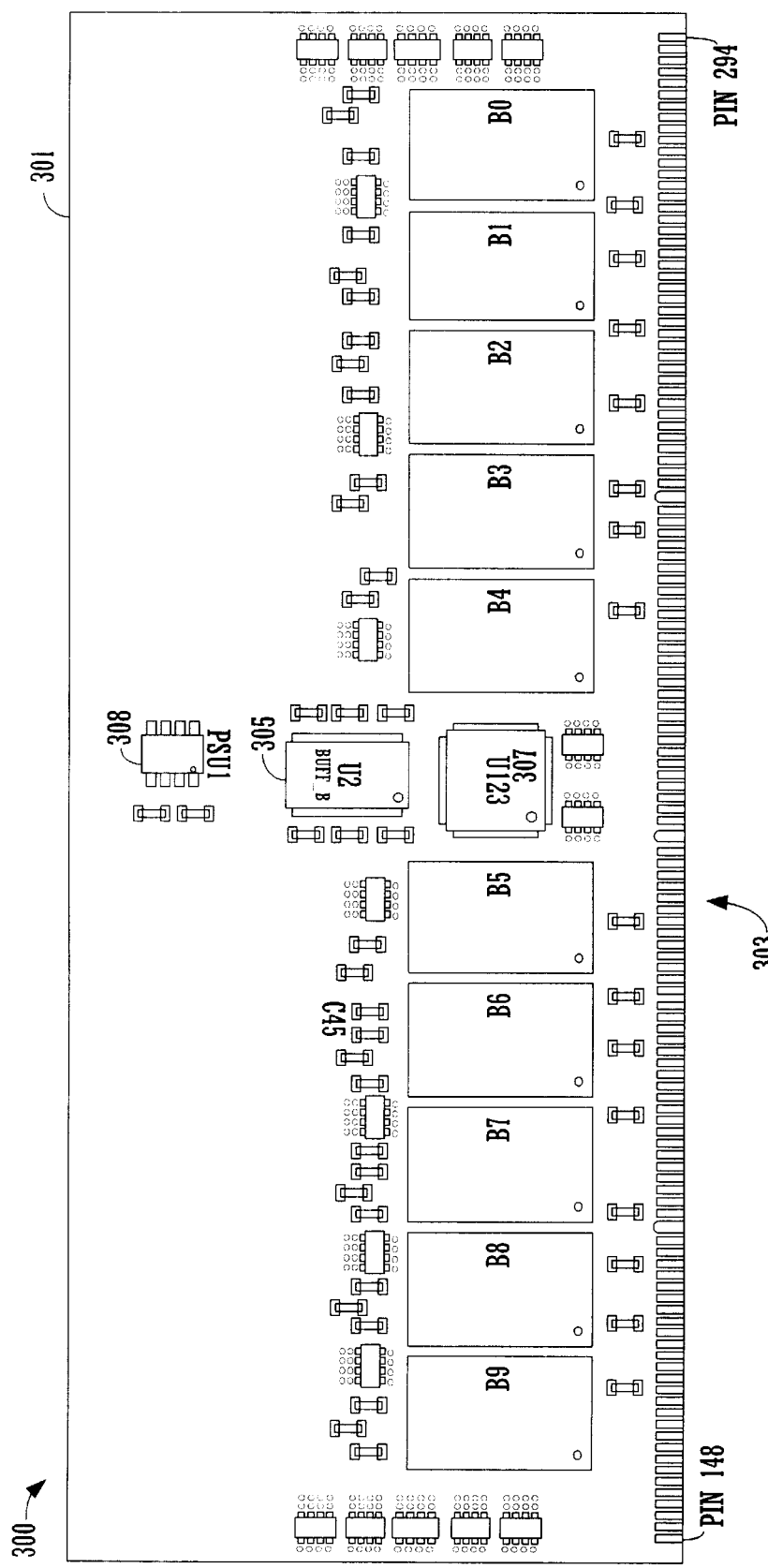
FIG. 4 is rear side view of the memory module shown in FIG. 3 in accordance with the present claimed invention.

FIGS. 3–19 show a specific embodiment of a memory module 300 that includes twenty memory components. Referring now to FIGS. 3–4, memory module 300 includes two banks of memory components. Bank A of memory components is disposed on the front side of memory module 300 and bank B is disposed on the rear side of memory module 300. Bank A includes memory components A0–A9. Memory components A0–A9 are attached to circuit card 301 and are selectively electrically coupled to contact pads 303 by conductive traces (not shown). In one embodiment, contact pads 303 are comprised of 294 individual contact pads, referred to hereinafter as pins 1–294. In this embodiment, memory components A0–A9 are selectively electrically coupled to ones of pins 1–294.

Referring now to FIG. 4, bank B includes memory components B0–B9. Memory components B0–B9 are attached to circuit card 301 and are selectively electrically coupled to pins 1–294 by conductive traces (not shown). In one embodiment, memory components A0–A9 of FIG. 3 and memory components B0–B9 of FIG. 4 are 8 megabit by 8 DDR SDRAMs configured to store 72 bits of data for a data density of 128 Megabytes. Alternatively, memory components A0–A9 of FIG. 3 and memory components B0–B9 of FIG. 4 are 16 megabit by 8 DDR SDRAMs configured to store 72 bits of data for a data density of 256 Megabytes.

Contact pads 303 of FIGS. 3–4 includes a total of 294 pins, with pins 1–147 located on the front side of memory module 300 (FIG. 3) and pins 148–294 disposed on the rear side of memory module 300 (FIG. 4). However, the present invention is well adapted for using a greater or lesser number of pins.

Continuing with FIGS. 3–4, clock buffer 304 is disposed on the front side of memory module 300 and clock buffer 305 is disposed on the rear side of memory module 300. In one embodiment, clock buffers 304–305 are 1:10 clock buffers.

Still referring to FIGS. 3–4, address/control buffer 306 is disposed on the front side of memory module 300 and address/control buffer 307 is disposed on the rear side of memory module 300. In one embodiment, address/control buffers 306–307 are 20-bit buffers that operate at 3.5 nanoseconds (ns).

Referring to FIG. 4, identification device 308 provides for identification of memory module 300. Identification device 308 is attached to circuit board 301 and is selectively electrically coupled to ones of pins 1–294 by conductive lines (not shown). In one embodiment, identification device 308 is a serial Electrical Erasable Programmable Read Only Memory (EEPROM) device that stores data pertaining to memory module 300. In one embodiment, identification device 308 stores a serial number, the type of memory components A0–A9 and B0–B9, the manufacturer, the date of manufacture, and the amount of memory on the memory module.

Figure 5:
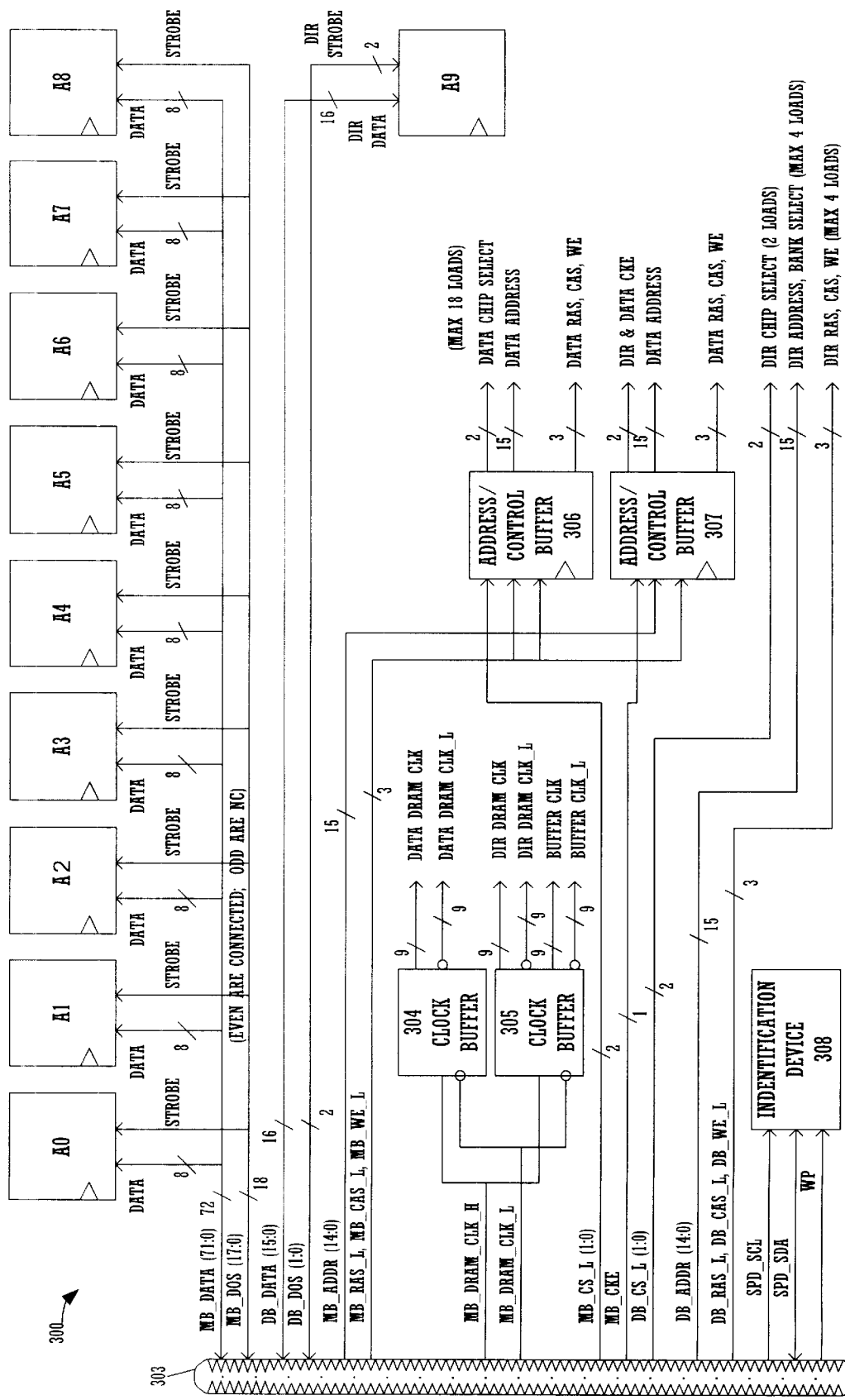
FIG. 5 is a diagram showing some of the components of a memory module that includes twenty memory components in accordance with the present claimed invention.

FIG. 5 shows memory components A0–A8 to be coupled to data lines for the storage of data. In one embodiment, memory module 300 includes 72 main memory data input and output signals and 16 directory memory data input and output signals. Memory component A9 is used for storing a directory. That is, directory information is stored in memory component A9 that indicates the location of data in memory components A0–A8.

Continuing with FIG. 5, memory components B0–B8 (not shown) are also coupled to data lines for the storage of data. Memory component B9 (not shown) is used for storing a directory that indicates the location of data in memory components B0–B8.

Continuing with FIG. 5, main memory (A0–A8 and B0–B8) and directory memory (A9 and B9) have separate control and addressing with a common clock. The differential clock input is buffered on the memory module 300 by clock buffers 304–305. Address and control signals are buffered on the memory module by buffers 306–307. Identification device 308 is selectively coupled to pins 1–294 for identification of memory module 300.

Figure 6:
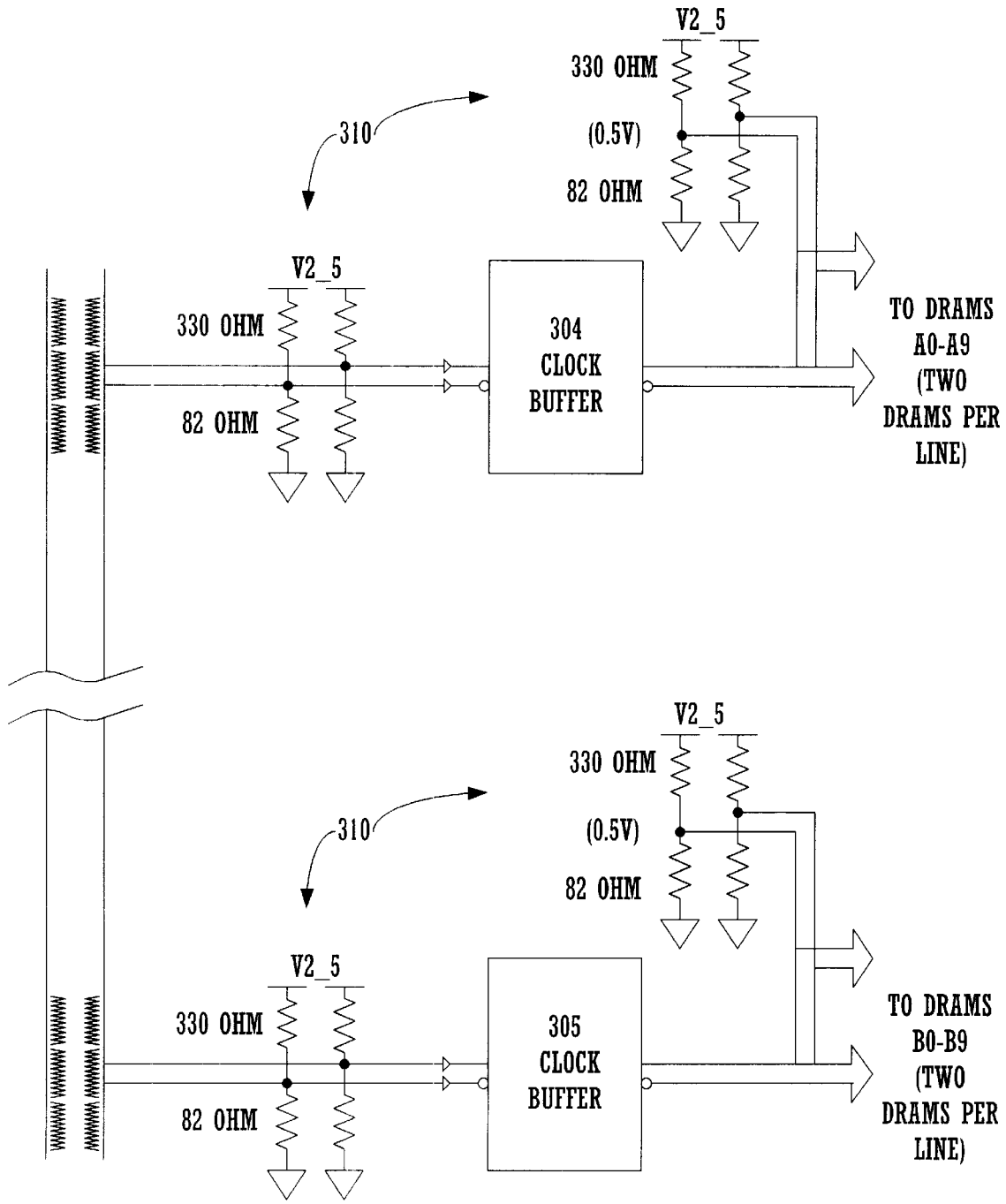
FIG. 6 is a diagram showing clock buffering and termination for a memory module that includes twenty memory components in accordance with the present claimed invention.

Referring now to FIG. 6, resistors, shown generally as resistors 310 are coupled to clock buffer 304. Clock buffer 304 is electrically coupled to ones of pins 1–294 and to DRAMS A0–A9. Similarly, resistors 310 are coupled to clock buffer 305. Clock buffer 305 is electrically coupled to ones of pins 1–294 and to DRAMS B0–B9.

Figure 7:
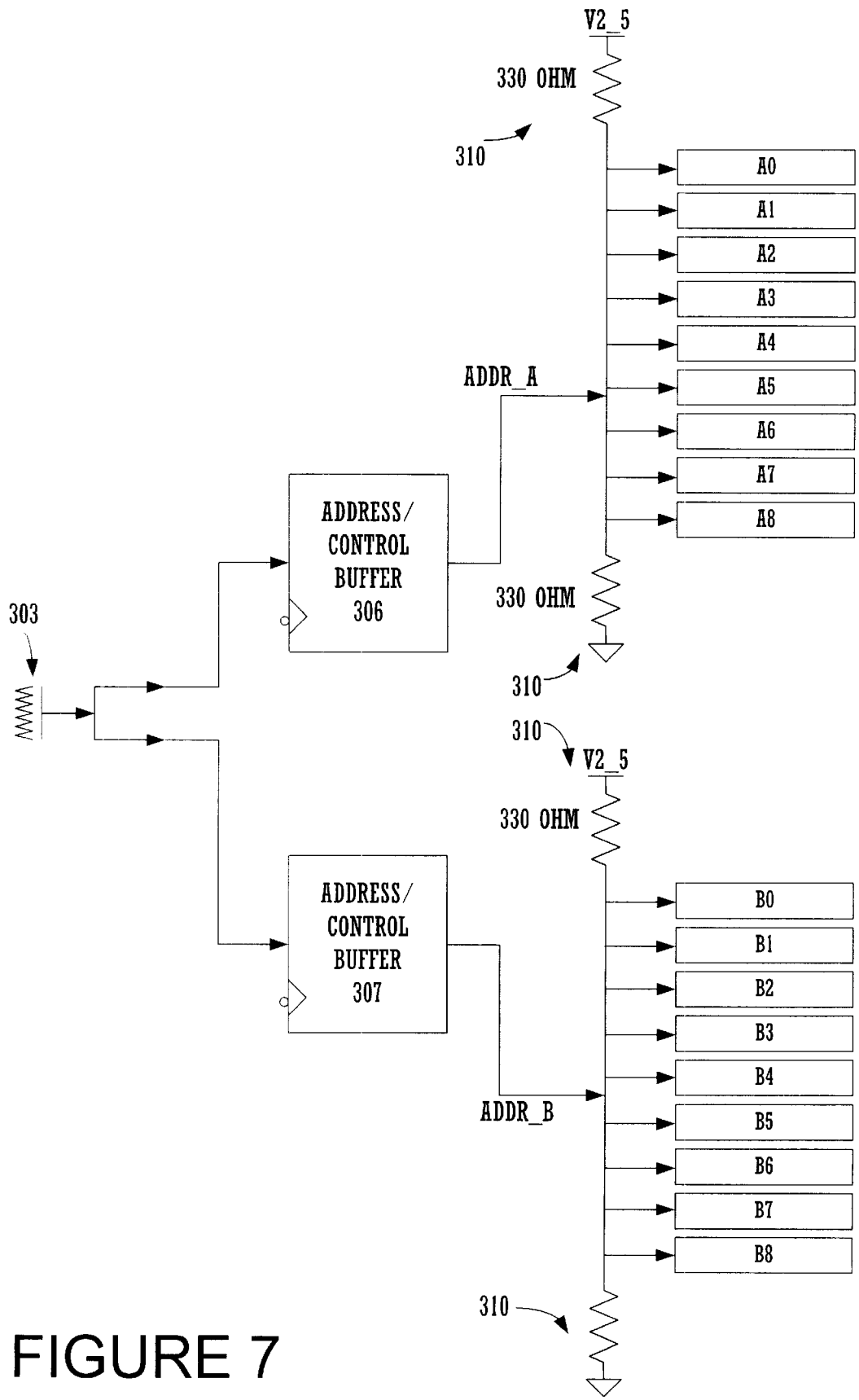
FIG. 7 is a diagram showing memory address and control buffering for a memory module that includes twenty memory components in accordance with the present claimed invention.

FIG. 7 shows address/control buffers 306–307 to be selectively electrically connected to pins 1–294 and to ones of memory components A0–A8 and B0–B8. More particularly, address/control buffer 306 is electrically coupled to resistors, shown generally as resistors 310, and to memory components A0–A8. Address/control buffer 307 is electrically coupled to resistors 310 and to memory components B0–B8.

Figure 8:
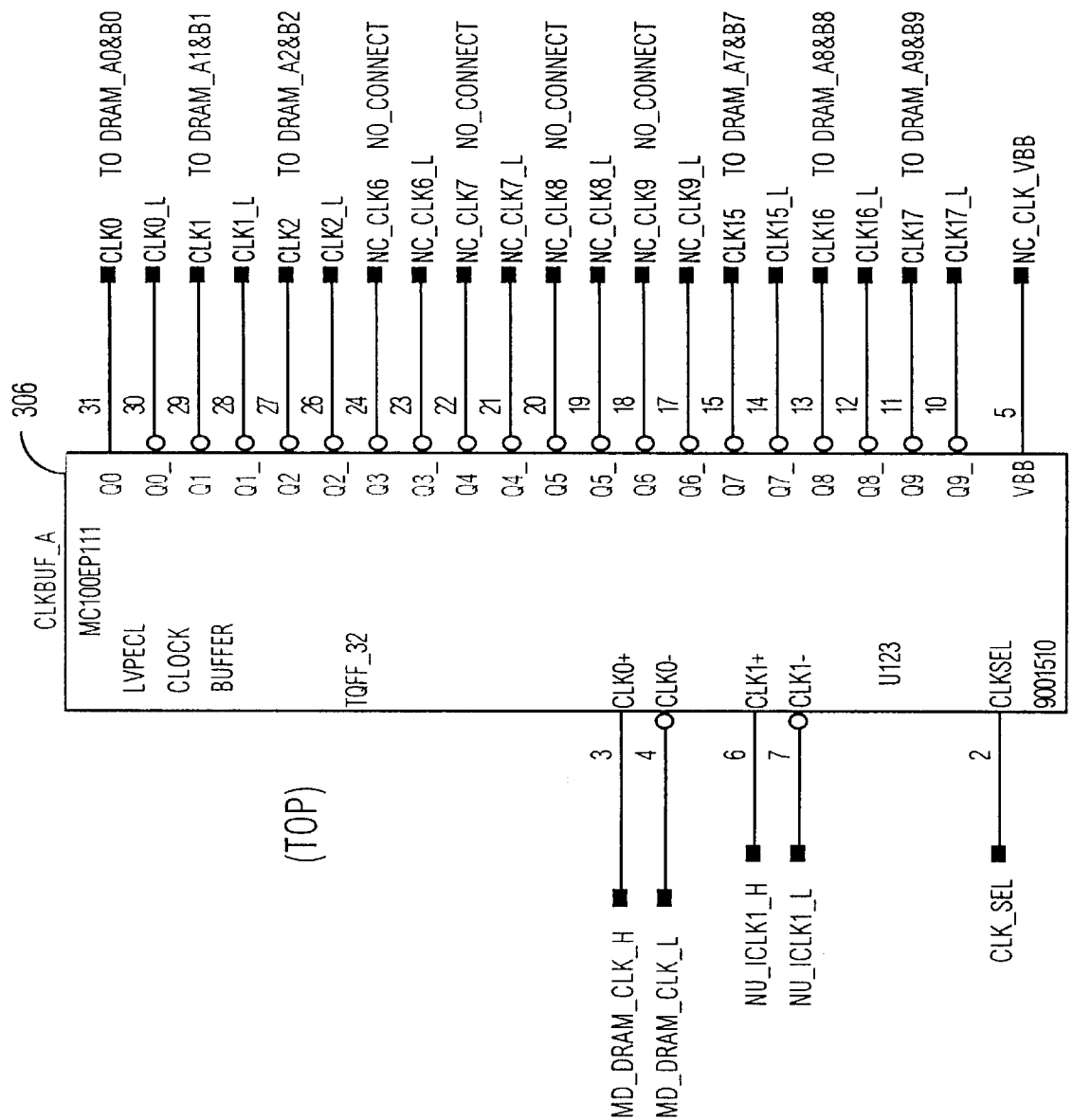
FIG. 8 is diagram showing connections to clock buffers and resistors that couple to the clock buffers for a memory module that includes twenty memory components in accordance with the present claimed invention.
Figure 8:
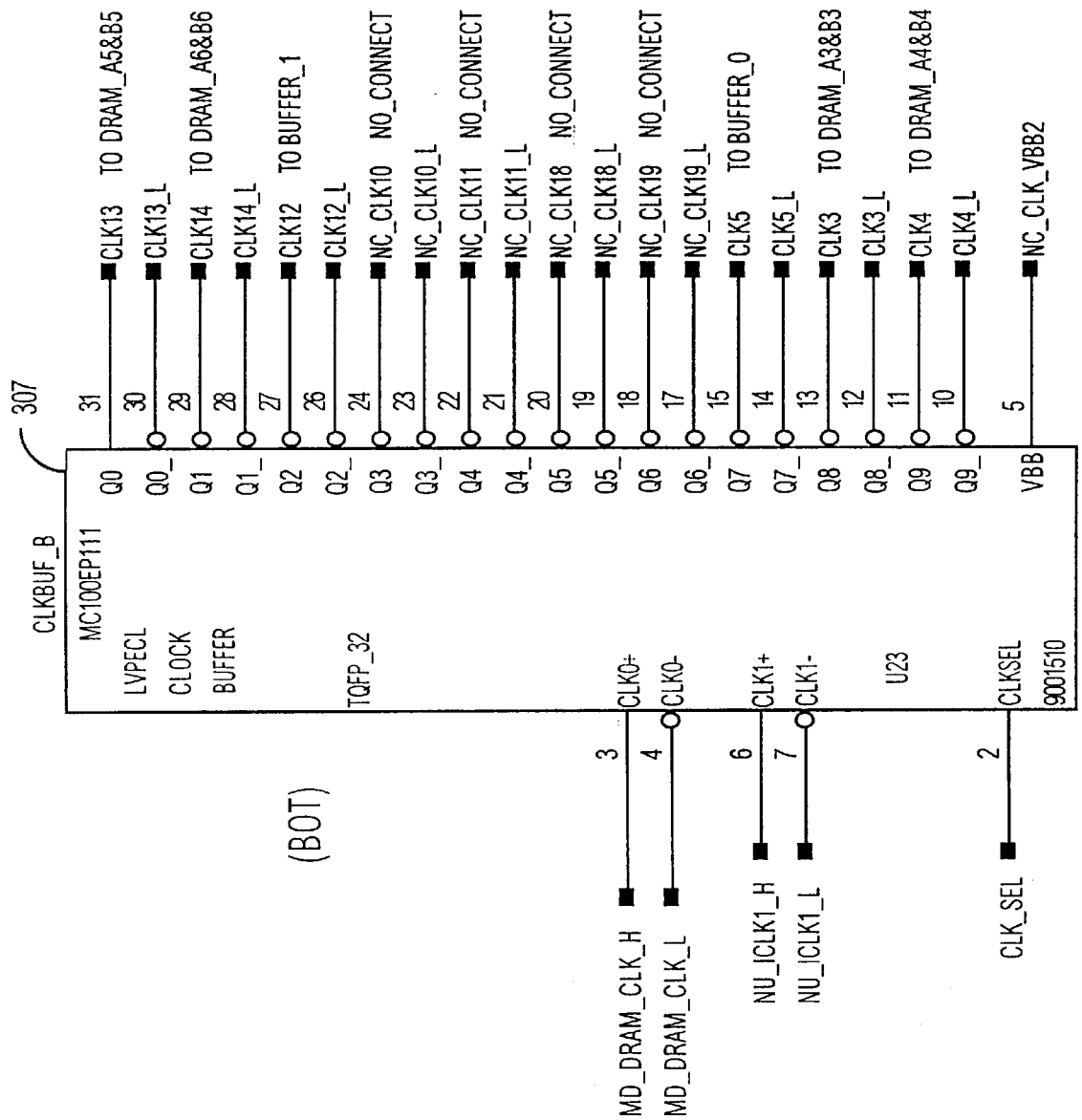
Figure 8:
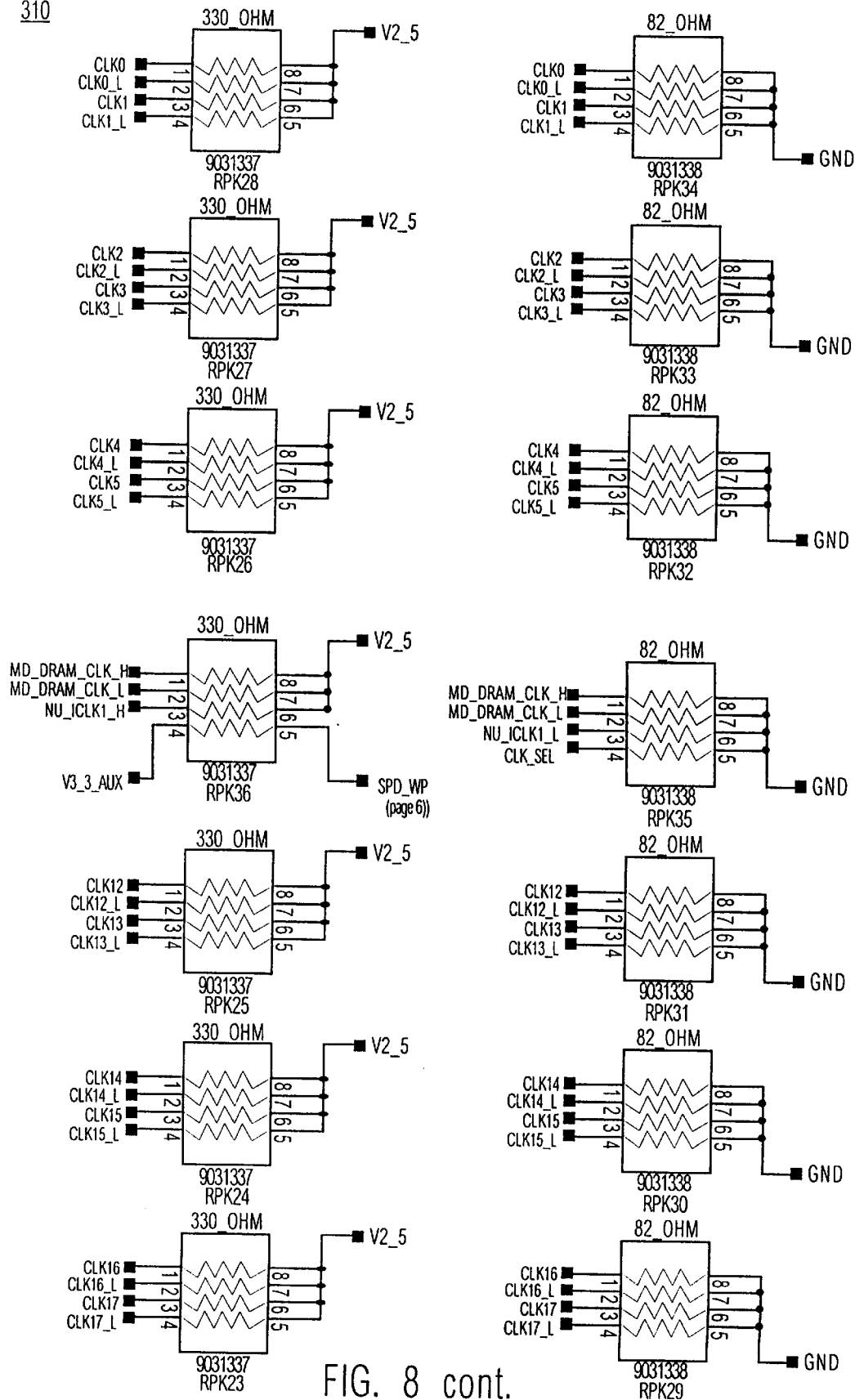

Referring now to FIG. 8, connections to clock buffers 306–307 and terminations are shown. Clock buffer 306 is shown to be electrically coupled to memory components A0–A2, B0–B2, A7–A9, and to B7–B9. Clock buffer 307 is electrically coupled to memory components A3–A6 and B3–B6. Clock buffers 306–307 are also electrically coupled to resistors, shown generally as resistors 310.

Figure 9:
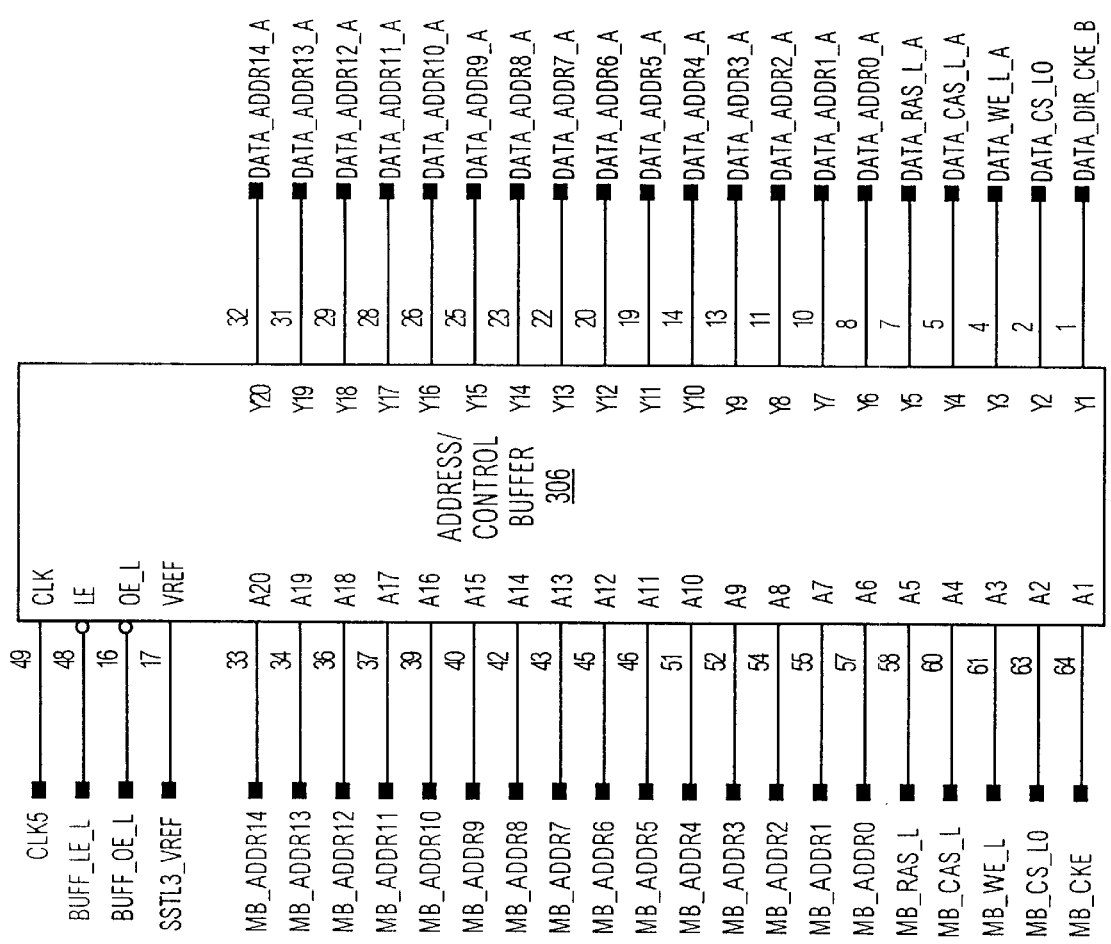
FIG. 9 is diagram showing connections to address/control buffers and capacitors and resistors that couple to the address/control buffers for a memory module that includes twenty memory components in accordance with the present claimed invention.
Figure 9:
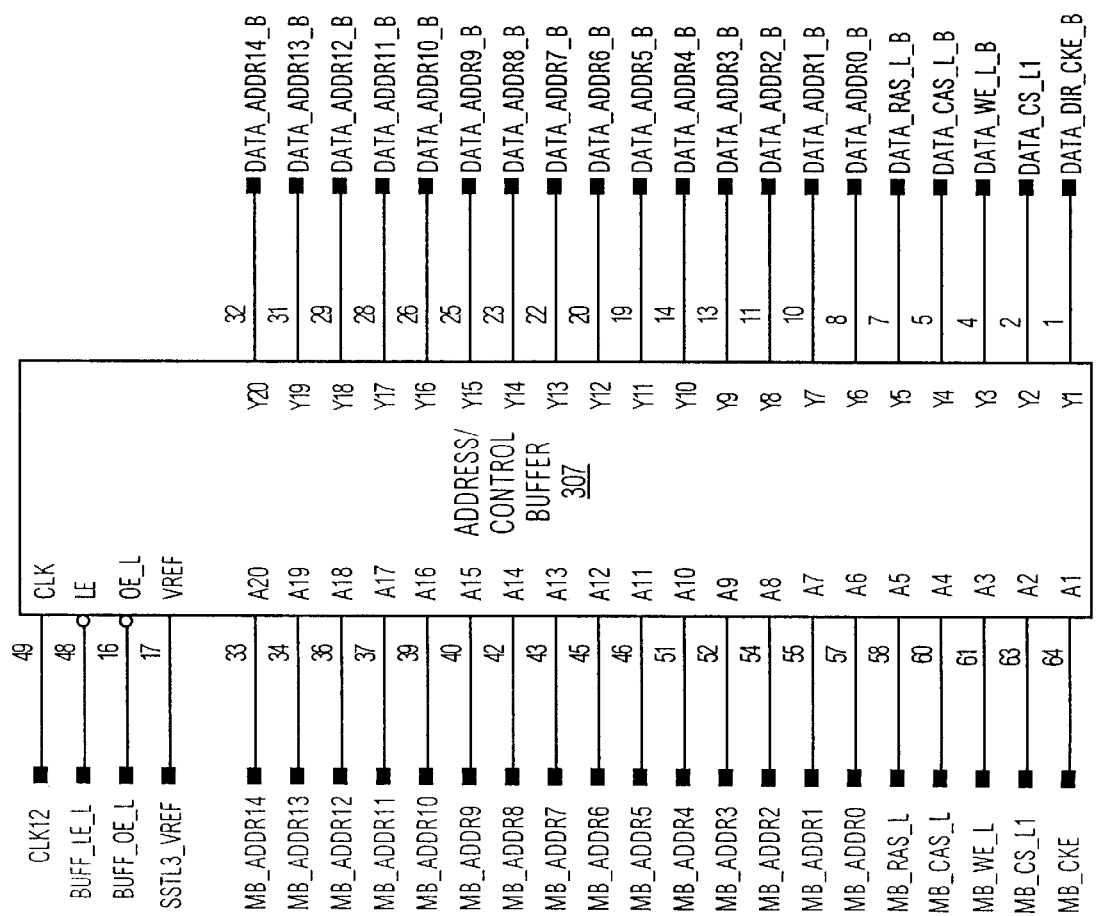
Figure 9:
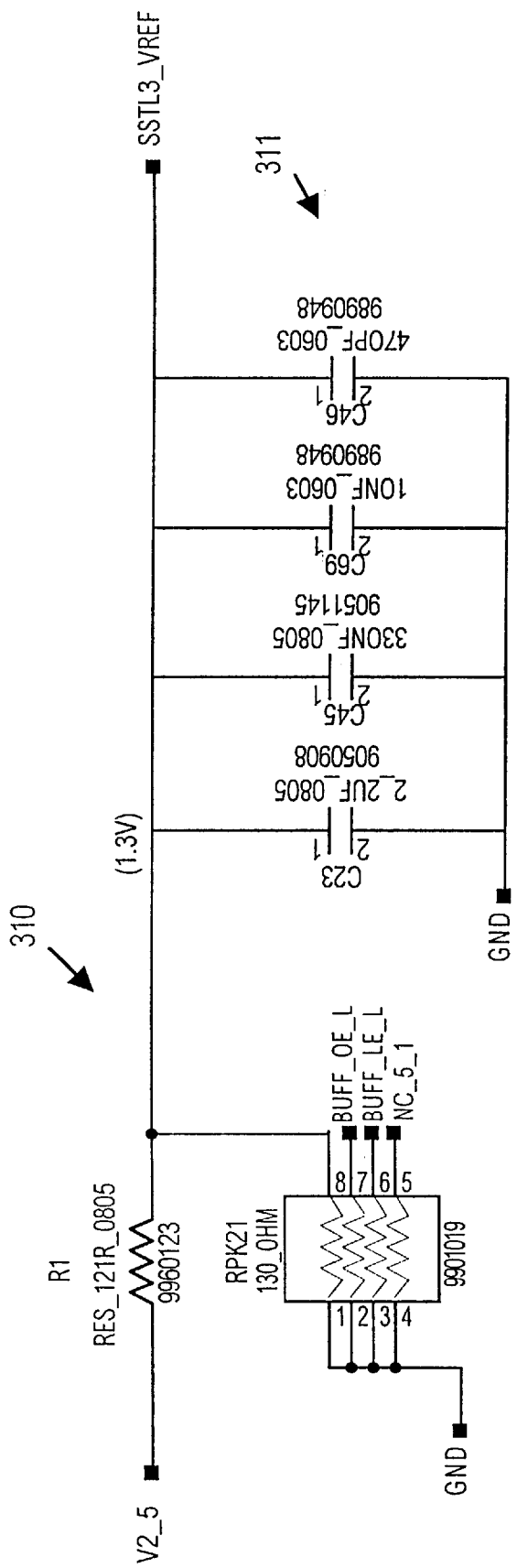
Figure 9:
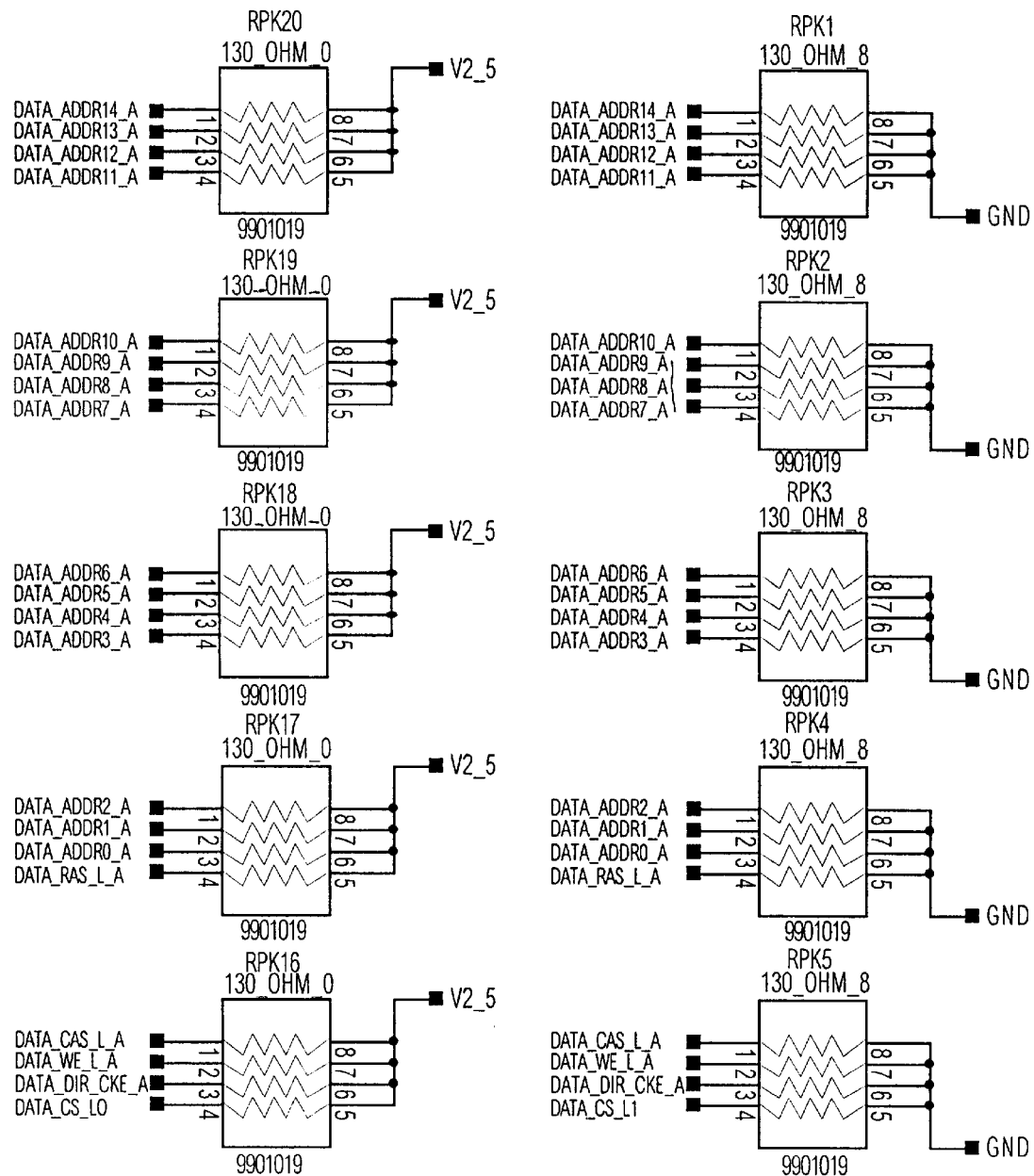
Figure 9:
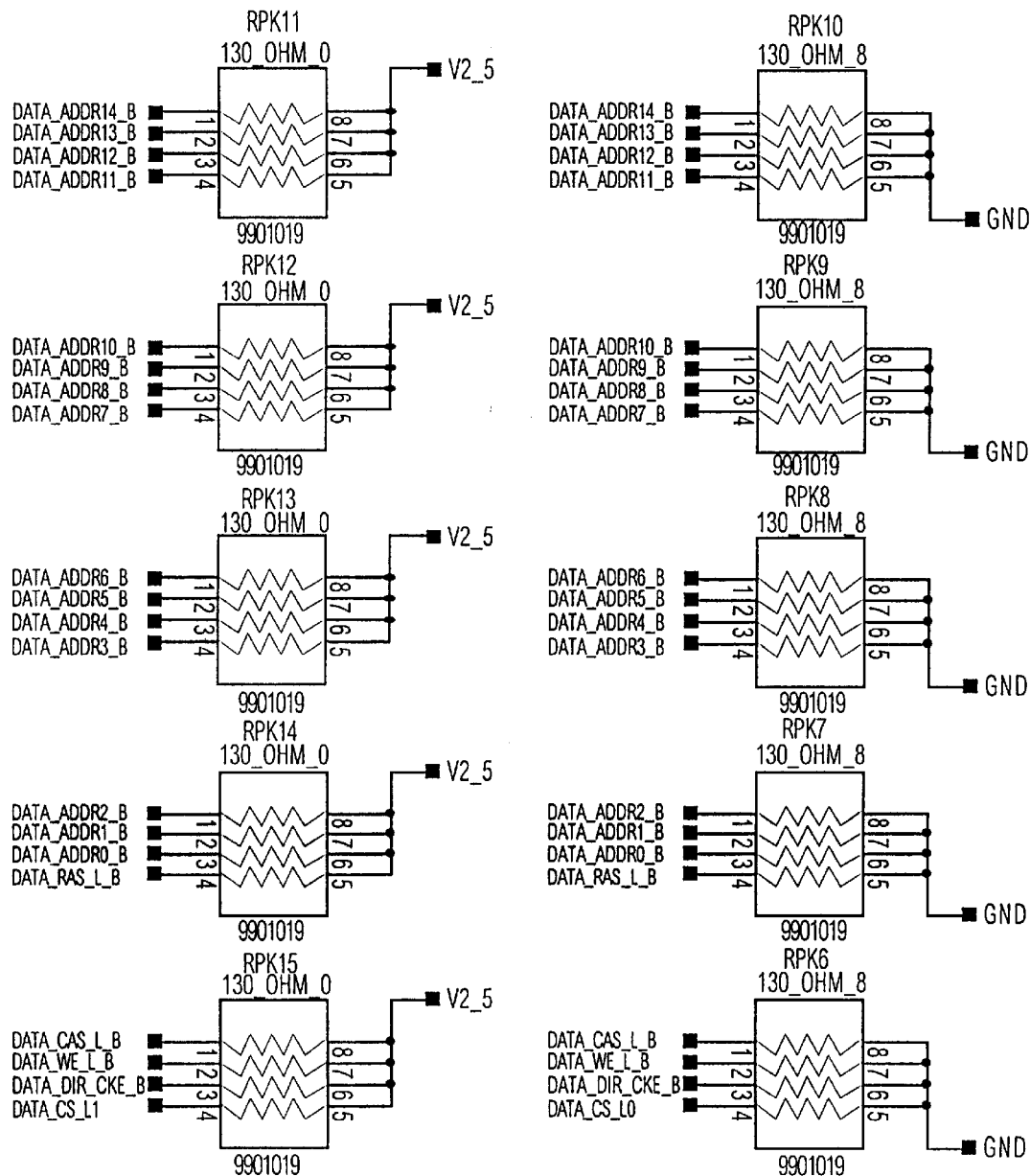

FIG. 9 shows data address/control buffer connections and terminations. Address/control buffer 306 couples to memory components A0–A8 and to resistors, shown generally as resistors 310. Similarly, address/control buffer 307 couples to memory components B0–B8 and to resistors 310. Address/control buffer 307 is selectively coupled to ones of resistors 310 by capacitors, shown generally as capacitors 311.

Figure 10:
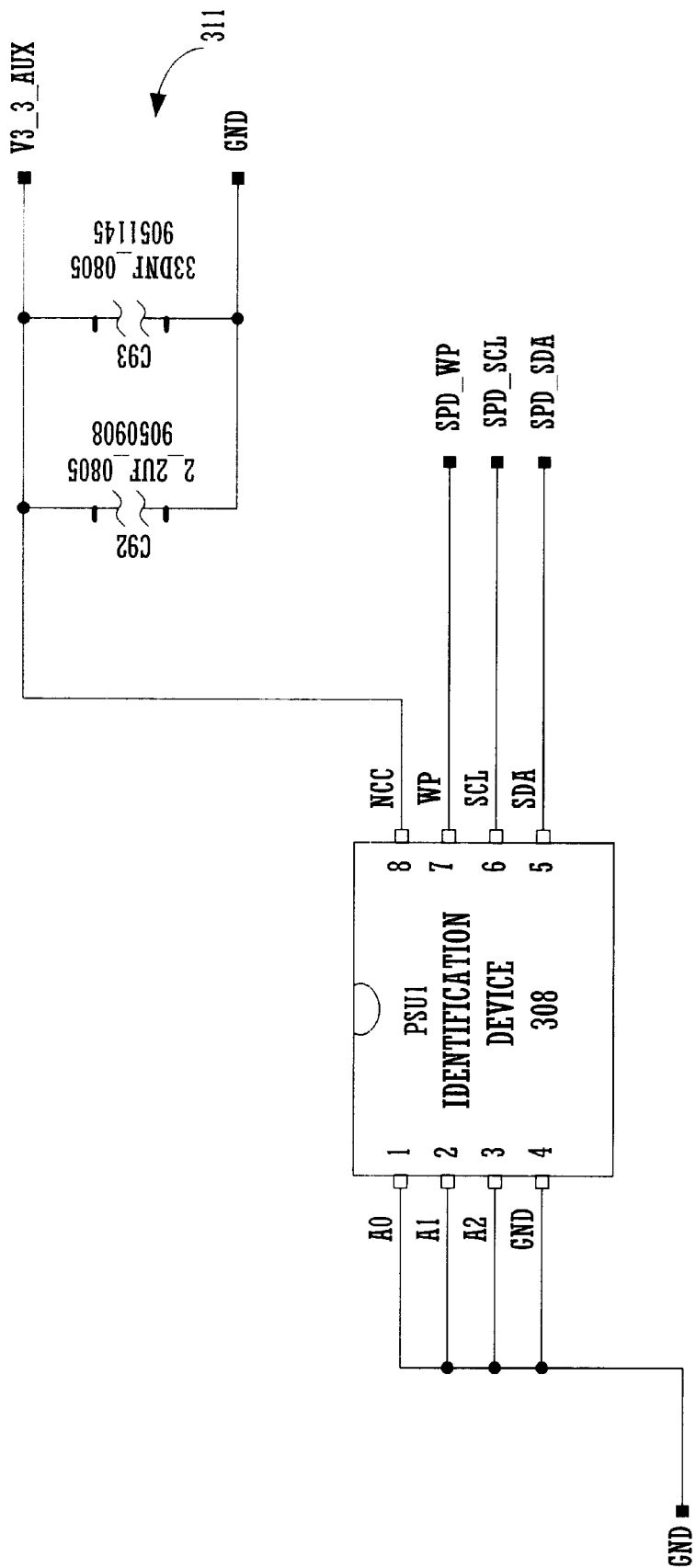
FIG. 10 is a diagram showing an identification device for a memory module that includes twenty memory components in accordance with the present claimed invention.

Referring now to FIG. 10, identification device 308 is coupled to capacitors, shown generally as capacitors 311. In one embodiment, identification device 308 is a 256×8 bit, 2-wire, serial EEPROM. In one embodiment, identification device 308 stores a serial number and information indicating the type of memory components used (e.g. manufacturer, date of manufacture, part number, etc.).

Figure 11:
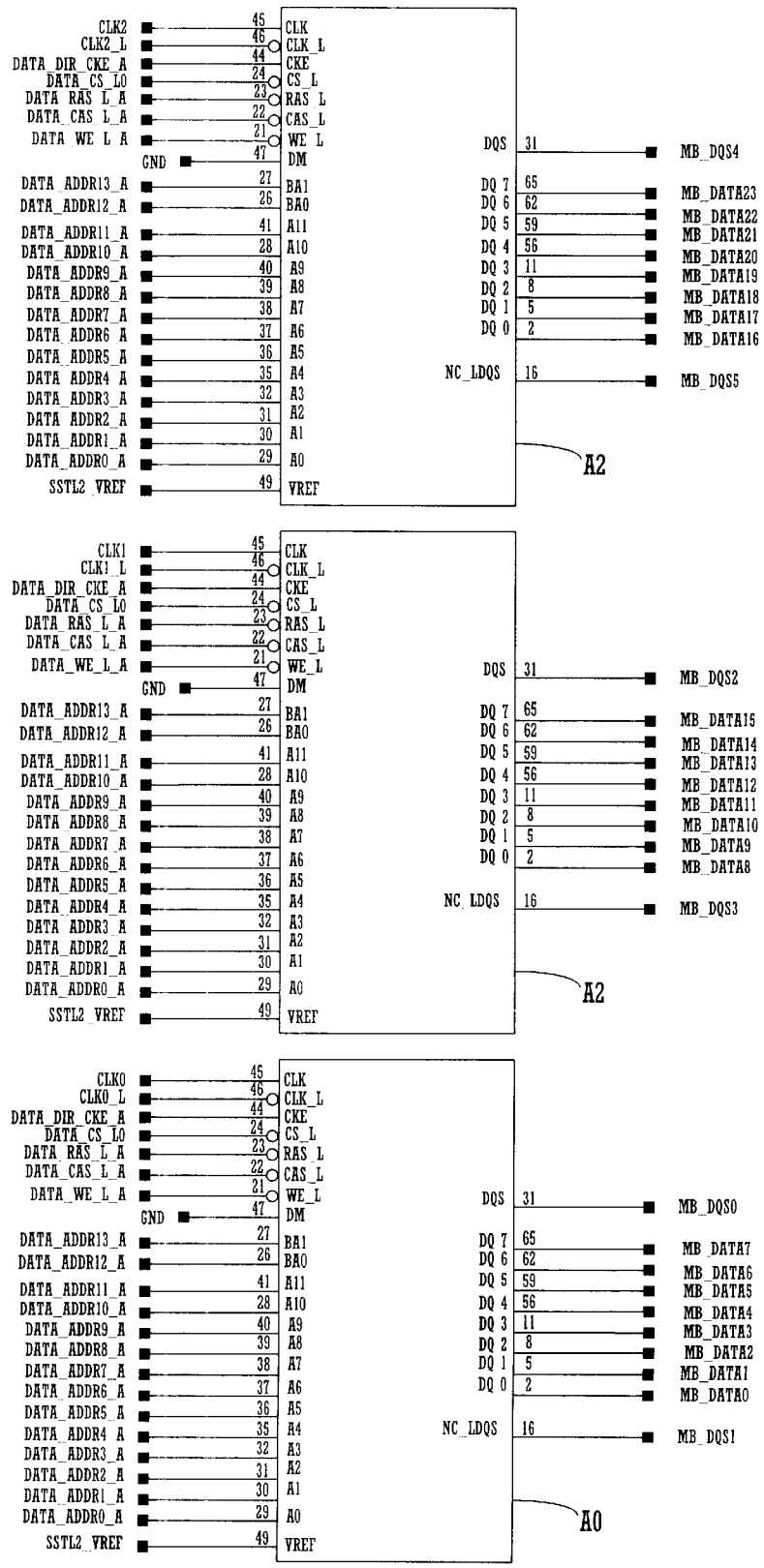
FIG. 11 is a diagram showing connections to the memory components of bank A for a memory module that includes twenty memory components in accordance with the present claimed invention.

Referring now to FIG. 11, connections to memory components A0–A8 are shown. Data is addressed through 14 address lines, shown as DATA ADDR0 A–DATA ADDR13 A, that couple to each of memory components A0–A8. Data is coupled from memory components A0–A8 over a total of 72 data lines, shown as data lines MB DATA 0–MB DATA71.

Figure 12:
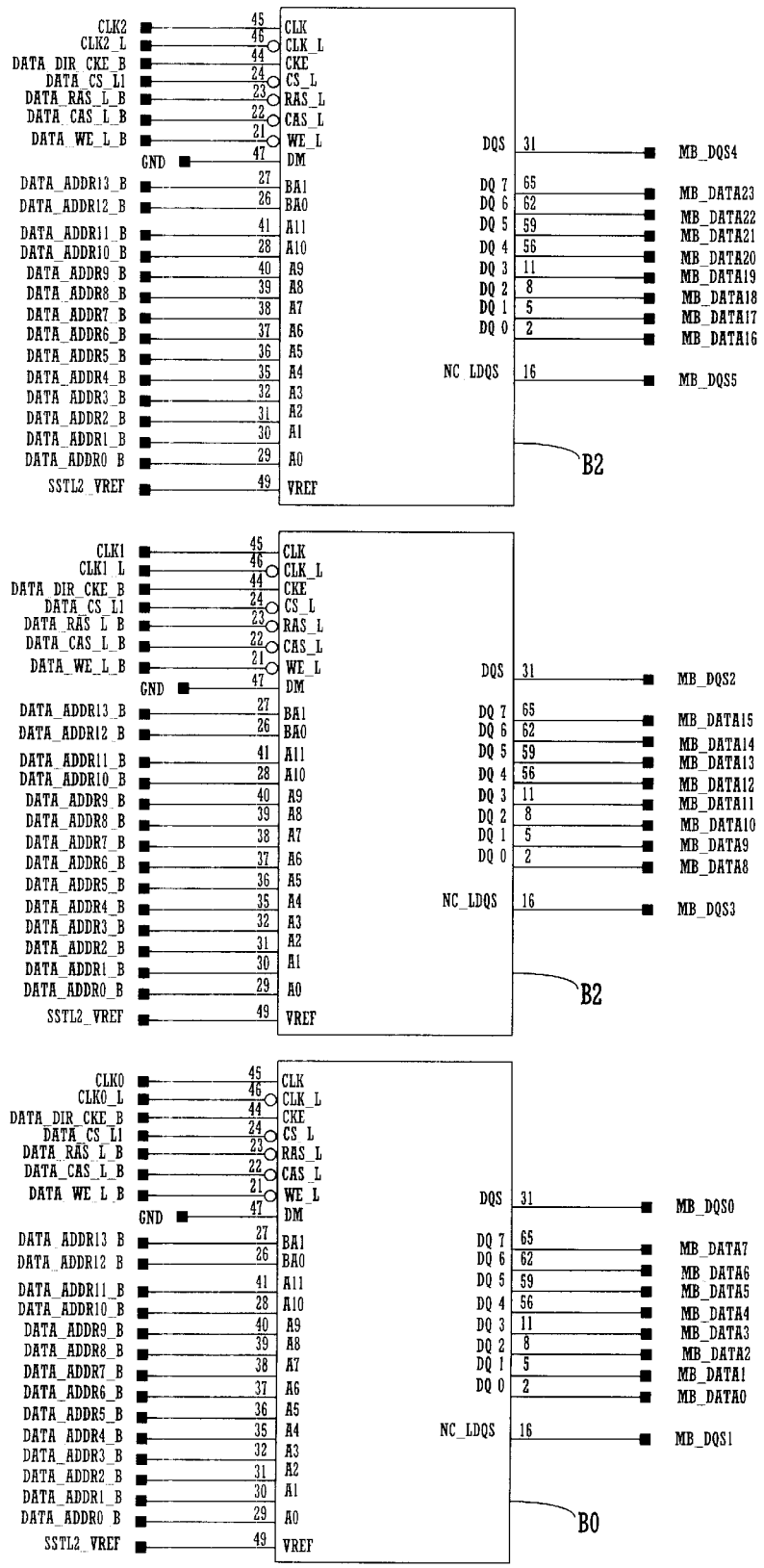
FIG. 12 is a diagram showing connections to the memory components of bank B for a memory module that includes twenty memory components in accordance with the present claimed invention.
Figure 12:
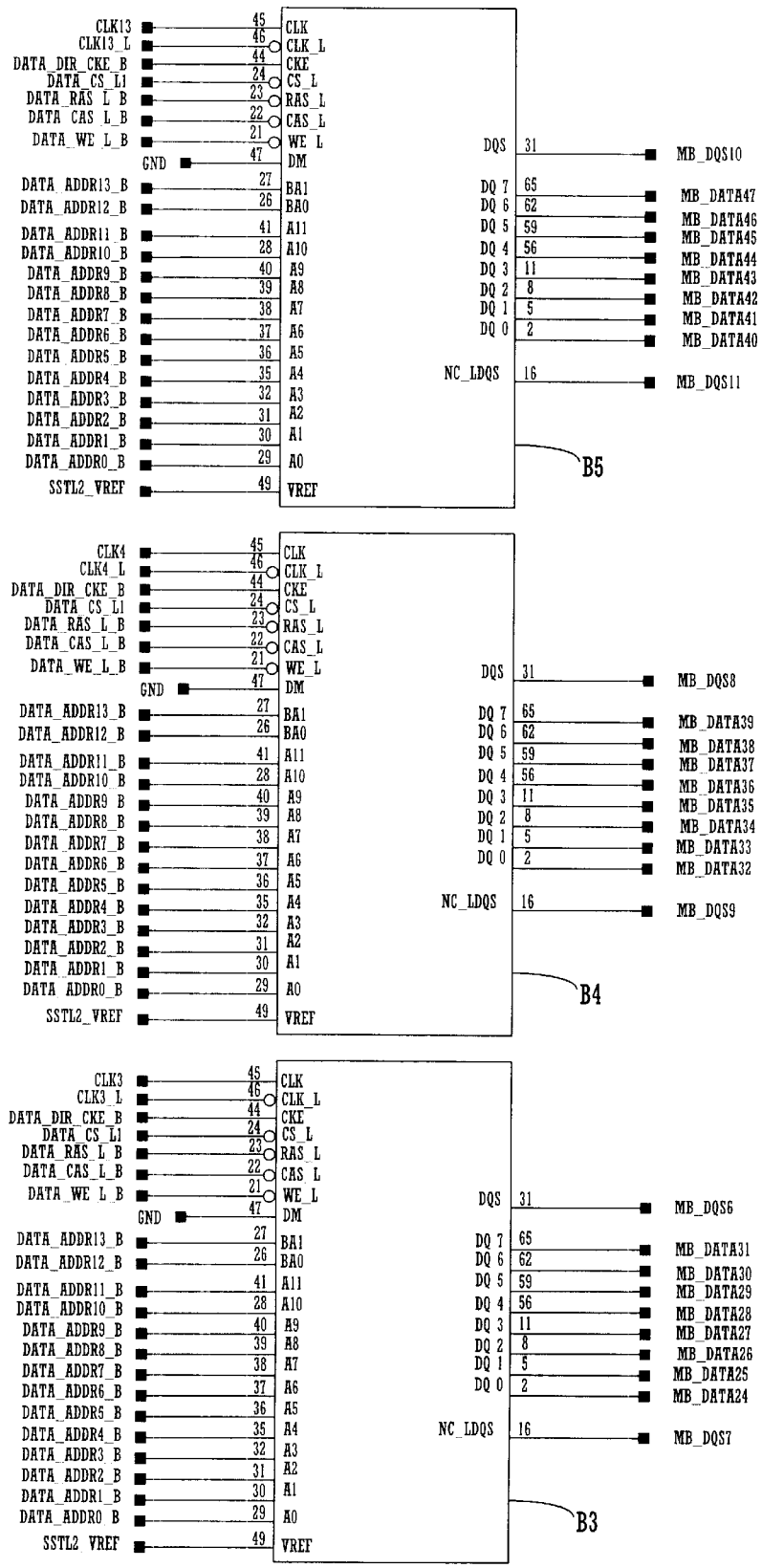
Figure 12:
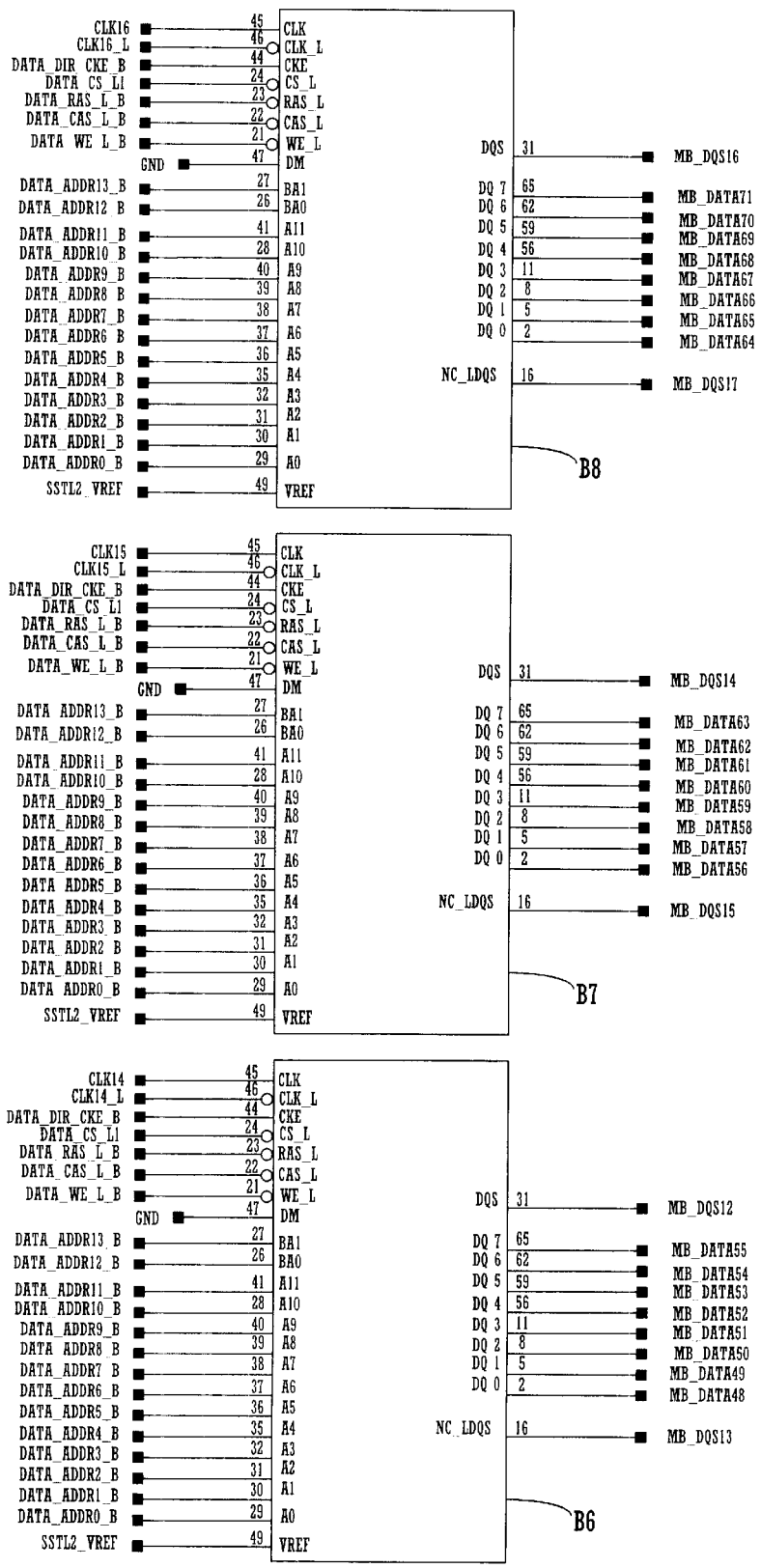

FIG. 12 shows connections to memory components B0–B8. Data is addressed through 14 address lines, shown as DATA ADDR0 B–DATA ADDR13 B, that couple to each of memory components B0–B8. Data is coupled from memory components B0–B8 over a total of 72 data lines, shown as data lines MB DATA 0–MB DATA71.

FIG. 13 shows connections to memory components A9 and B9. As previously discussed, memory components A0 and B9 operate as a directory for memory components A0–A8 and B0–B8. Memory component A9 couples to 16 lines of directory data, shown as DB DATA0–DB DATA15 for output of directory data. Memory component A9 is addressed through 14 directory address lines, shown as DB ADDR0–DB ADDR13. Similarly, memory component B9 couples to 16 lines of directory data, shown as DB DATA0–DB DATA15 for output of directory data. Memory component B9 is addressed through 14 directory address lines, shown as DB ADDR0–DB ADDR13.

Figure 14:
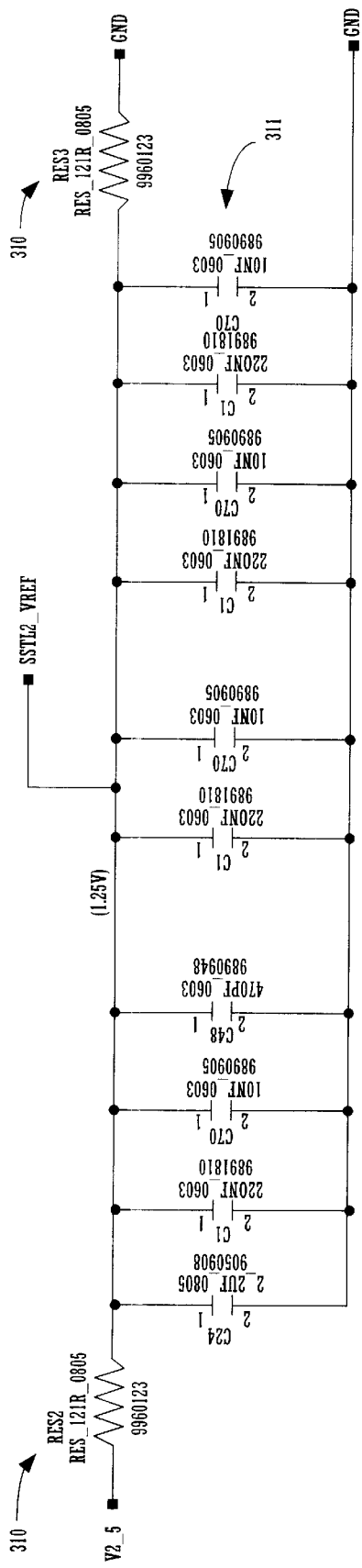
FIG. 14 is a diagram showing reference Voltage ($V_{REF}$) generation and bypassing for a memory module that includes twenty memory components in accordance with the present claimed invention.
Figure 15:
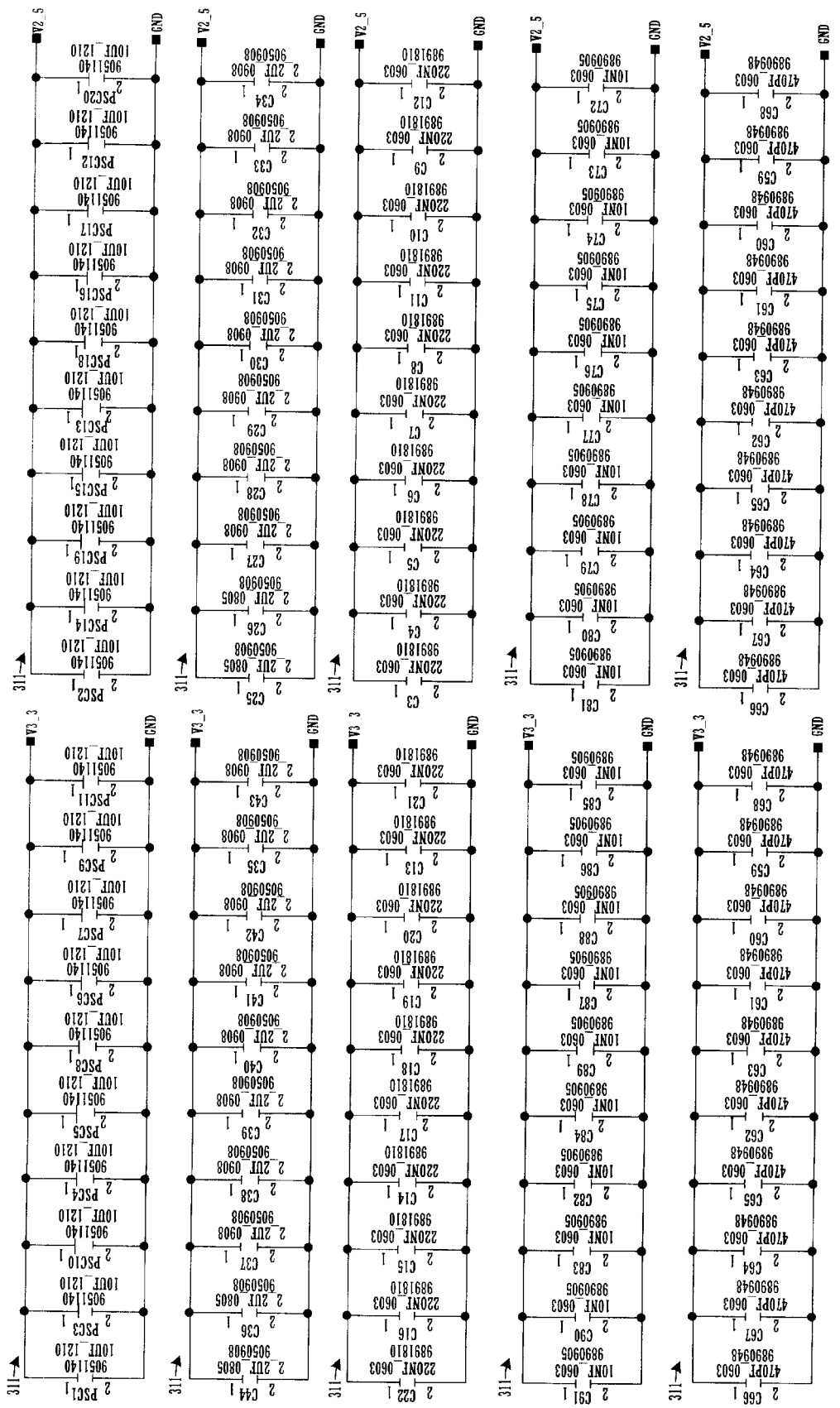
FIG. 15 is a diagram showing Voltage bypassing for a memory module that includes twenty memory components in accordance with the present claimed invention.

Reference voltage generation and bypassing circuits are shown in FIGS. 14 and 15 to include resistors, shown generally as resistor 310, and capacitors, shown generally as capacitors 311.

Figure 16:
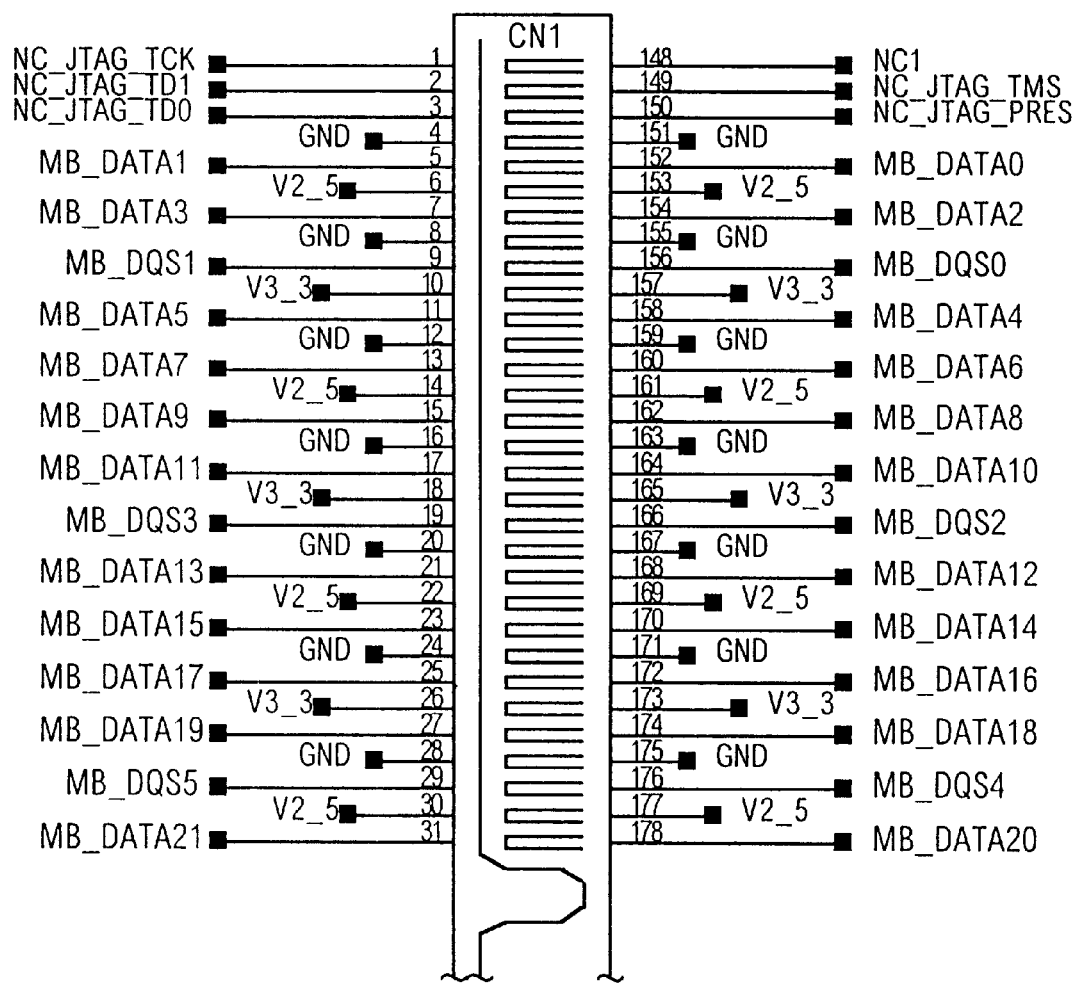
FIG. 16 is a diagram showing pin connections for a memory module that includes twenty memory components in accordance with the present claimed invention.
Figure 16:
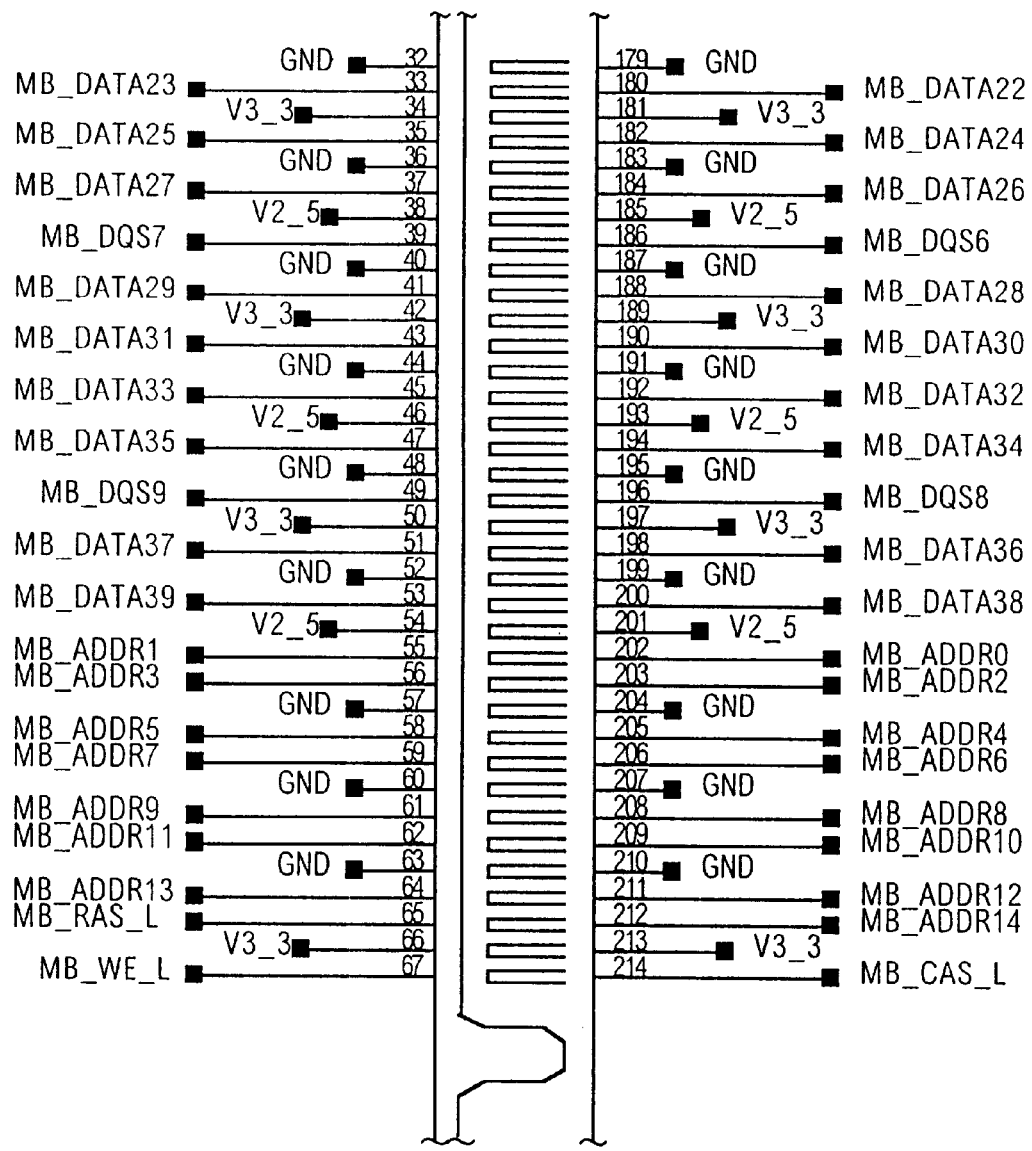
Figure 16:
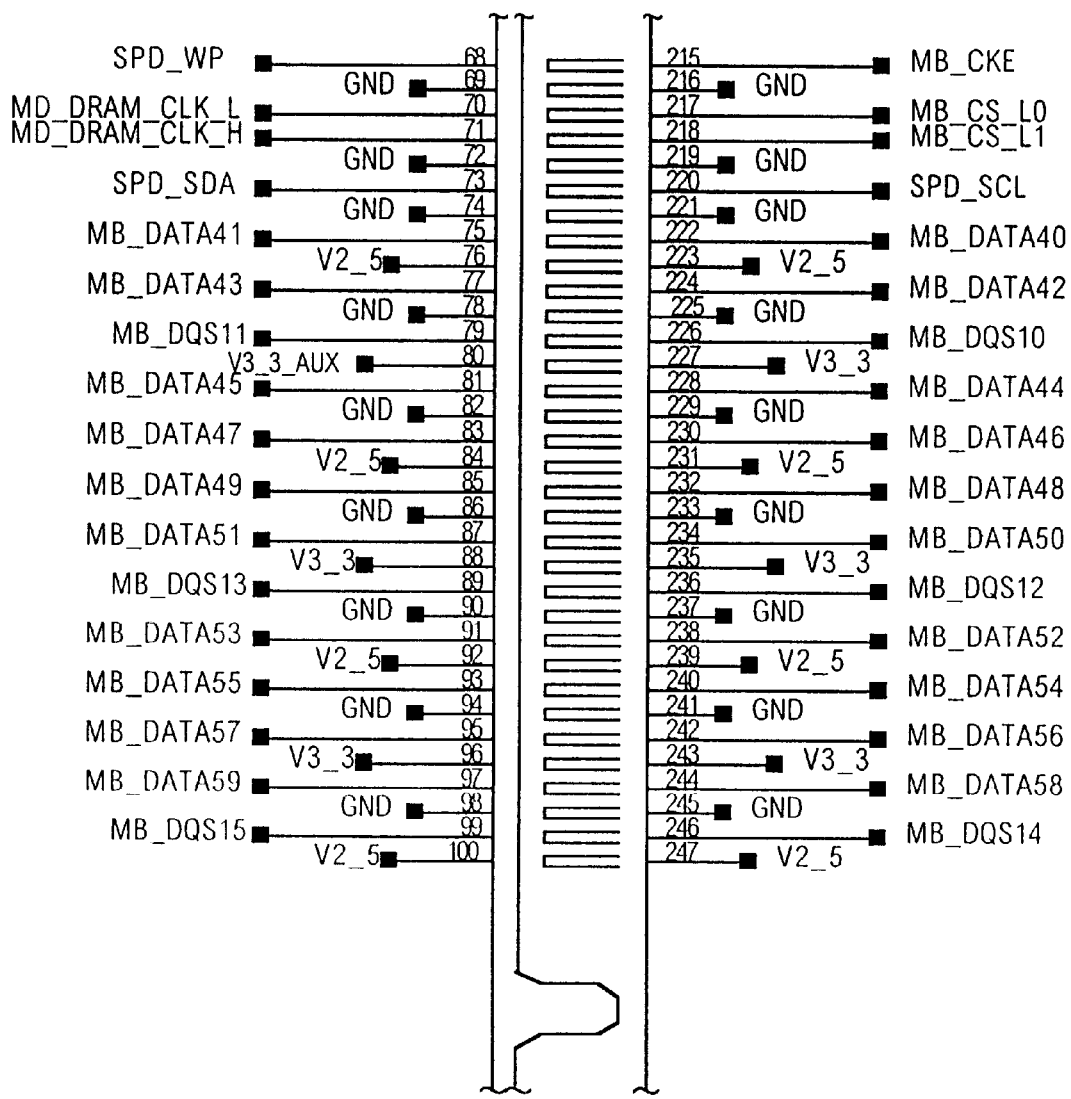

FIG. 16 shows connections to individual pins of contact pads 303. Each of the 294 individual pins of contact pads 303 is assigned a number from 1 to 294. FIG. 17 shows the functions assigned to each particular pin of pins 1–294.

FIG. 18 include a chart showing pins, signals, input and output (I/O, signal type, name and definitions for various signals. Referring now to FIGS. 16–18, pins 70 and 71 couple clock signals (CK). Pin 215 couples clock enable (CKE) signals.

Pins 217–218 couple chip select signals (CS). Row address strobe (RAS) signals are conveyed through pin 65. Column address strobe (CAS) signals are conveyed through pin 214. Write enable (WE) signals are conveyed through pin 67. Main memory address signals (A0–A12) are coupled through pins 55, 56, 58, 59, 61, 62, 202, 203, 205, 206, 208, 209, 211. Bank address (BA0, BA1) signals coupled through pins 64 and 211, defining to which bank an activate, read, write, or precharge command is being applied.

Continuing with FIGS. 16–18, data input and output signals (DQ) are conveyed through pins 5, 7, 11, 13, 15, 17, 21, 23, 25, 27, 31, 33, 35, 37, 41, 43, 45, 47, 51, 53, 75, 77, 81, 83, 85, 87, 91, 93, 95, 97, 101, 103, 105, 107, 109, 111, 113, 152, 154, 158, 160, 162, 164, 168, 170, 172, 174, 178, 180, 182, 184, 188, 190, 192, 194, 198,200, 222, 224, 228, 230, 232, 234, 238, 240, 242, 244,248,250, 252, 254, 258 and 260.

Directory related signals include signals for chip select (pins 293, 146), row address strobe (pin 143), column address strobe (pin 292), write enable (pin 145), directory address (pins 133–134, 136–137, 139–140, 280–281, 283–284, 286–287), directory bank address (pins 142–290), directory data I/O (pins 115, 117, 119, 121, 125, 127, 129, 131, 262, 263, 266, 268, 272,274, 276, 278) and directory data strobe (pins 123, 270).

Testing related signals include signals for test port clock (pin 1), test data in (pin 2), test data out (pin 3), test mode select (pin 149). Other signals include signals for serial data line (pin 73), serial data clock pin 220) and write protect (68). Power supply ($V_{DD}$) is provided (2.5 Volt) through pins 10, 18, 26, 34, 42, 50, 66, 88, 96, 104, 112, 120, 128, 138, 157, 165, 173, 181, 189, 197, 213, 227, 235, 243, 251, 259, 267, 275 and 285. Serial presence detect power supply (for identification device) is provided through pin 80. Output data Power supply ($V_{DDQ}$) is provided (2.5 Volt) through pins 6, 14, 22, 30, 38, 46, 54, 76, 84, 92, 100, 116, 124, 132, 153, 161, 169, 177, 185, 193, 201, 223, 231, 239, 247, 255, 263, 271 and 279. Electrical ground (GND) is provided through pins 4, 8, 12, 16, 20, 24, 28, 32, 36, 40, 44, 48, 52, 57, 60, 63, 69, 72, 74, 78, 82, 86, 90, 94, 98, 102, 106, 110, 114, 118, 12, 126, 128, 130, 135, 141, 144, 147, 151, 155, 159, 163, 167, 171, 175, 179, 183, 187, 191, 195, 199, 204, 207, 210, 216, 219, 221, 225, 229, 233, 237, 241, 245, 249, 253, 257, 261, 265, 269, 273, 277, 282, 288, 291 and 294.

In one embodiment, timing conditions meet the criteria specified in FIG. 19 as indicated in nanoseconds (ns) clock cycles ($t_{CK}$) milliseconds (ms), or picoseconds (ps). Data access time, Data output hold time, Data output low impedance, and Data output high impedance are measured from the clock signal's rising edge. Row cycle time is measured from refresh/activate to refresh/activate. Row access time is from row address to read data, and Row precharge time is from precharge to refresh/activate.

Referring to FIGS. 1–18, in one embodiment, memory devices are Double Data Rate SDRAMs that use a 2n prefetch architecture to achieve high-speed operation by interface designed to transfer two data words per clock cycle at the I/O pins of the SDRAM. Thus, a single read or write access for the each DDR SDRAM consists of a single, one clock cycle data transfer at the internal SDRAM core and two corresponding one-half-clock cycle data transfer at the data I/O pins of the SDRAM. The bidirectional data strobes (DQS(n)) are transferred externally, along with data, for use in data capture at the receiver. DQS is an intermittent strobe transmitted by memory components during READs and by the memory controller during WRITEs. DQS is edge-aligned with data for READs and center-aligned with data for WRITEs. The memory components operate from a differential clock. Commands (address and control signals) are registered at every positive edge of CK. Input data is registered on both edges of DQS, and output data is referenced to both edges of DQS, as well as to both edges of CK. Read and write accesses to the memory components are burst oriented; accesses start at a selected location and continue for a programmed number of locations in a programmed sequence.

Access begins with the registration of an ACTIVATE command, which is then followed by a READ or Write command. The address bits registered coincident with the Activate command are used to select the bank and row to be accessed (BA0–BA1 select the bank; A0–A11 select the row). The address bits registered coincident with the READ or WRITE command are used to select the starting column location for the burst access. The memory component provides for programmable READ or WRITE burst lengths of 2, 4, or 8 locations. An AUTO PRECHARGE function may be enabled to provide a self-timed row precharge that is initiated at the end of the burst sequence. The pipelined, multiband architecture of the present invention allows for concurrent operation, thereby providing high effective bandwidth by hiding row precharge and activation time. An auto refresh mode is provided, along with a power-saving, power-down mode. In one embodiment, all inputs are compatible with the JDEC Standard for SSTL 2 and all outputs are SSTL 2, Class II compatible.

The memory components of the present invention may be addressed such that different parts of a memory word may be separately addressed with a unique address. This allows for the access of unaligned data in a single memory clock period. This is particularly advantageous for 3D graphics applications such as texture mapping where data structures may not be ideally aligned with respect to the memory word. This allows for accessing unaligned texture mapping data in a sustained fashion by presenting different address information on one or more of the address busses every memory clock period. Thus, the system memory module of the present invention meets the needs of recent graphics rendering engines and provides good 3D Graphics performance.

In one embodiment of the present invention, burst length is programmable such that read and write access to memory components can be controlled. The burst length determines the maximum number of column locations that can be accessed for a given READ or WRITE command. Burst lengths of 2, 4, or 8 locations are available for both the sequential and the interleaved burst types. As a READ or WRITE command is issued, a block of columns equal to the burst length is effectively selected. All access for that burst take place within this block, meaning that the burst will wrap within the block if a boundary is reached. The block is uniquely selected by A1–A8 when the burst length is set to two. The block is uniquely selected by A3–A8 when the burst length is set to four and by A3–A8 when the burst length is set to eight. The remaining (least significant) address bits are used to select the starting location within the block. The programmed burst length applies to both READ and WRITE bursts.

Figure 20:
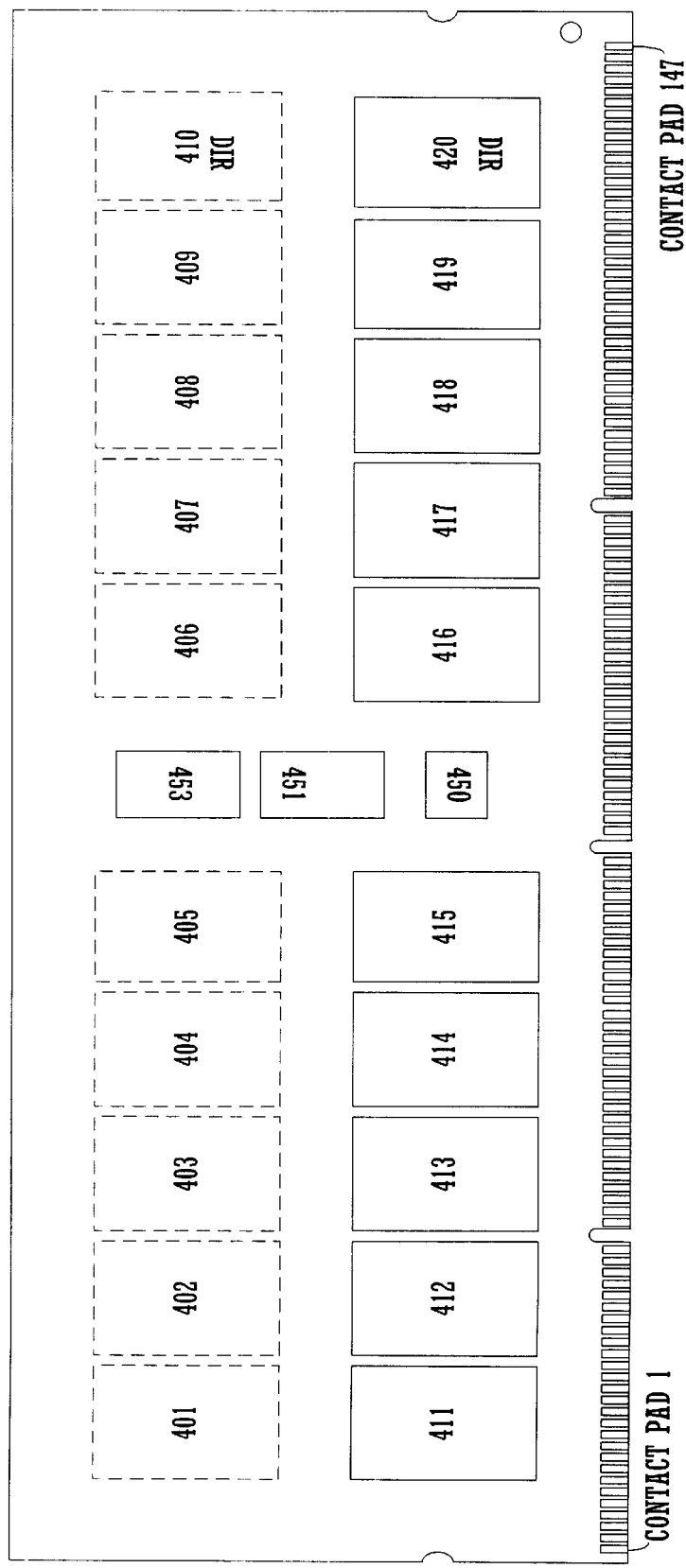
FIG. 20 is a front view of a memory module that includes forty memory components in accordance with one embodiment of the present claimed invention.
Figure 21:
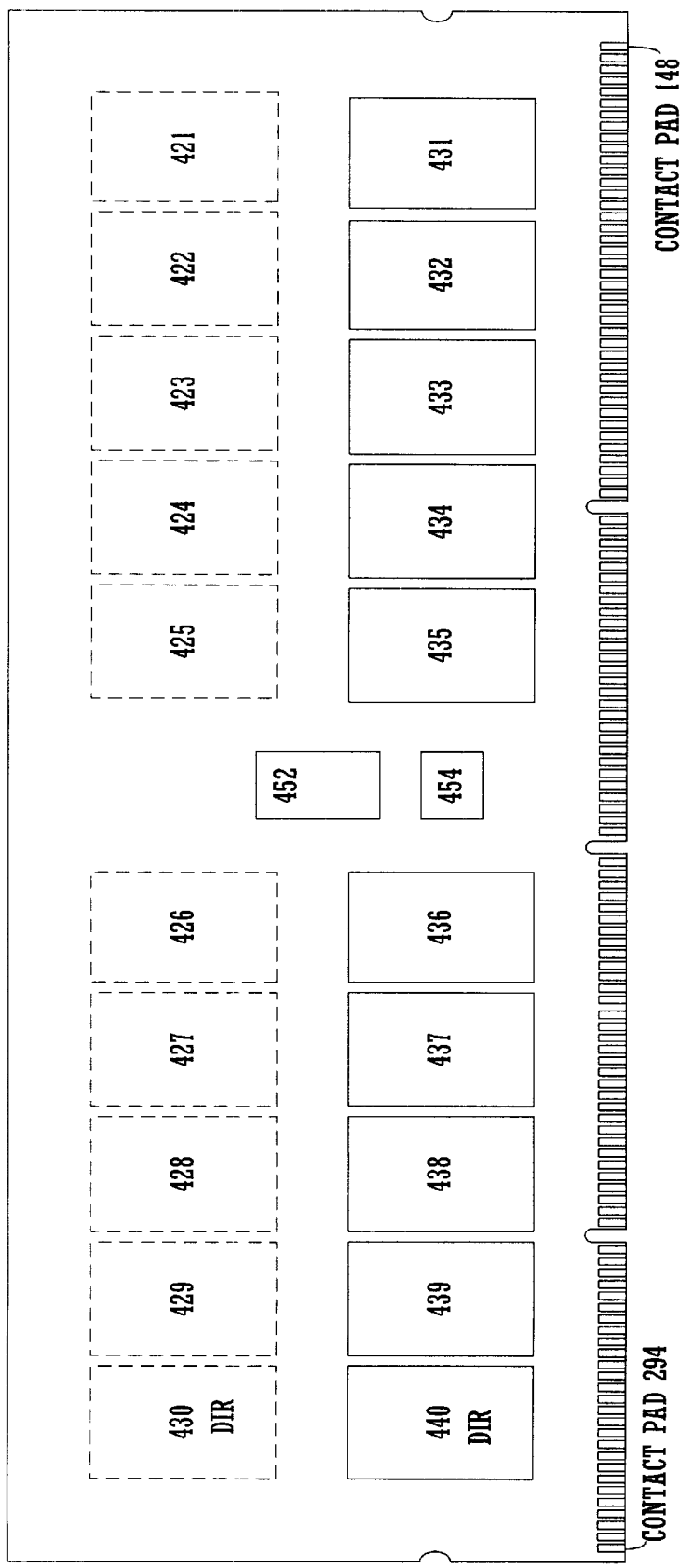
FIG. 21 is a rear view of a memory module of FIG. 20 in accordance with one embodiment of the present claimed invention.

The memory system of the present invention is well adapted for using memory modules having fewer or more memory components than is shown in FIGS. 1–19. FIGS. 20–21 show an embodiment that includes a memory module 400 that includes 40 memory components. Referring now to FIG. 20, memory components 401–420 are disposed on the front side of memory module 400. In one embodiment, memory modules 401–409 and 411–419 form a main memory bank while memory modules 410 and 420 are used for directory data.

Referring now to FIG. 21, memory components 421–440 are disposed on the rear side of memory module 400. In one embodiment, memory modules 421–429 and 431–439 form a main memory bank while memory modules 430 and 440 are used for directory data.

Memory module 400 of FIGS. 20–21 also includes clock buffers 451–452 and address/control buffers 453–454 for clock buffering and buffering of address and control signals. Identification device 450 allows for identification of memory module 400.

The memory system of the present invention includes resistors mounted on the motherboard and the same set of resistors is used to terminate data lines of multiple memory modules. Because only two memory modules are active at any time, only a sufficient number of resistors to terminate two memory modules is required. Thus, the memory system of the present invention requires fewer resistors than prior art memory systems that include memory modules that have resistors for data termination on each memory module (a full set of resistors is required on each prior art memory module). Because fewer resistors are required, the memory system of the present invention is less expensive than prior art memory systems that include memory modules that have resistors for data termination on each memory module.

By using switches that are placed on the motherboard, the memory system of the present invention achieves a shorter circuit than that of prior art memory systems that include switches located on each memory module. That is, by placing the switches on the motherboard, there is no need to drive the connector receptacle and the circuitry on each memory module that leads to a switch as is required by prior art memory modules that include switches located on each memory module. This also results in reduced distortion and interference resulting from radio frequency interference.

As previously discussed, the present invention includes switches placed on the motherboard. Thus, there is no need to place switches on each memory module. Because the memory modules of the present invention do not include switches, they are less expensive than prior art memory modules that include switches. Also, the memory modules of the present invention are less expensive because they do not require Series Stub Termination Logic (SSTL) related circuits on the memory module.

The present invention includes resistors for data termination that are disposed on the motherboard. Thus, there is no need to place resistors on each memory module for terminating data lines. Because the memory module of the present invention does not include resistors, the memory module of the present invention is less expensive than prior art memory modules that include resistors for data line termination.

The memory module of the present invention can be manufactured in a size that is physically smaller than the size of prior art memory modules. That is, because there is no need to place switches on each memory module, the memory module of the present invention can be made smaller than prior art memory modules that include switches. Also, because there is no need to place resistors on each memory module for terminating data lines, the memory module of the present invention can be made smaller than prior art memory modules that include resistors for data line termination.

The memory system and memory module of the present invention has a high memory component capacity and a high data bandwidth while minimizing distortion. Also, the memory module of the present invention meets the above requirements and is inexpensive to manufacture. In addition, the memory module of the present invention is smaller than prior art memory modules that include switches.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory module comprising:
    a plurality of pins adapted to be coupled to a connector receptacle of a computer, said plurality of pins comprising 294 pins, with 108 of said pins adapted to couple data signals;
    a plurality of memory components, each of said memory components selectively electrically coupled to ones of said pins, said plurality of memory components adapted to send and receive data over ones of said plurality of pins;
    an identification device selectively electrically coupled to ones of said pins; and
    wherein said memory module is adapted to be used in a memory system that includes switches that couple to each of said pins that couple data signals, said memory module not having switches disposed thereon that couple to each of said pins that couple data signals.

2. The memory module of claim 1 wherein pins 5, 7, 11, 13, 15, 17, 21, 23, 25, 27, 31, 33, 35, 37, 41, 43, 45, 47, 51, 53, 75, 77, 81, 83, 85, 87, 91, 93, 95, 97, 101, 103, 105, 107, 109, 111, 113, 152, 154, 158, 160, 162, 164, 168, 170, 172, 174, 178, 180, 182, 184, 188, 190, 192, 194, 198, 200, 222, 224, 228, 230, 232, 234, 238, 240, 242, 244, 248, 250, 252, 254, 258 and 260 are adapted to couple data signals.

3. The memory module of claim 1 wherein 13 of said pins are adapted to couple address signals.

4. The memory module of claim 1 wherein pins 55, 56, 58, 59, 61, 62, 202, 203, 205, 206, 208, 209, 211 are adapted to couple address signals.

5. The memory module of claim 1 wherein pins 6, 14, 22, 30, 38, 46, 54, 76, 84, 92, 100, 116, 124, 132, 153, 161, 169, 177, 185, 193, 201, 223, 231, 239, 247, 255, 263, 271 and 279 are adapted to couple voltage.

6. The memory module of claim 1 wherein pins 217 and 218 are adapted to couple chip select signals.

7. The memory module of claim 1 wherein pin 65 is adapted to couple row address strobe signals.

8. The memory module of claim 1 wherein pin 214 is adapted to couple column address strobe signals.

9. The memory module of claim 1 wherein pin 67 is adapted to couple write enable signals.

10. The memory module of claim 9 wherein pins 70 and 71 are adapted to couple clock signals.

11. The memory module of claim 10 wherein pin 215 is adapted to couple clock enable signals.

12. A memory module comprising:
    a plurality of pins adapted to be coupled to a connector receptacle of a computer, said plurality of pins comprising 294 pins;
    a plurality of memory components, each of said memory components selectively electrically coupled to ones of said pins, said plurality of memory components adapted to send and receive data over ones of said plurality of pins;
    an identification device selectively electrically coupled to ones of said pins; and
    wherein at least 108 of said pins couple data signals, said memory module adapted to be used in a memory system that includes switches that couple to each of said pins that couple data signals, said memory module not having switches disposed thereon that couple to each of said pins that couple data signals, and said memory module not including resistors for terminating data signals on said memory module.

13. The memory module of claim 12 wherein pins 55, 56, 58, 59, 61, 62, 202, 203, 205, 206, 208, 209, 211 are adapted to couple address signals.

14. A memory module comprising:
    a circuit board having a connector adapted to be coupled to a connector receptacle of a computer, said connector including a first group of contact pads, a second group of contact pads and a third group of contact pads, said first group of contact pads including 108 contact pads adapted to couple data signals, said second group of contact pads adapted to couple address signals and said third group of contact pads adapted to couple control signals; and
    a plurality of memory components, each of said plurality of memory components disposed on said circuit board and electrically coupled to said connector, said plurality of memory components adapted to send and receive data through said connector, said memory module adapted to be used in a memory system that includes switches that couple to each of said first group of contact pads, said memory module not requiring switches disposed on said memory module for data isolation and not including resistors for terminating data signals.

15. The memory module of claim 14 wherein said third group of contact pads include contact pads adapted to couple row address strobe signals, column address strobe signals, chip select signals and write enable signals.

16. The memory module of claim 14 wherein said connector includes 294 contact pads.

17. The memory module of claim 14 further comprising:
    an identification device selectively electrically coupled to said connector.

18. The memory module of claim 14 wherein said plurality of memory components includes at least one double data rate DRAM.

19. The memory module of claim 14 wherein said plurality of memory components includes at least one double data rate SDRAM.

* * * * *